United States Patent
Wang et al.

(10) Patent No.: US 11,768,404 B1
(45) Date of Patent: Sep. 26, 2023

(54) DRIVING SUBSTRATE, BACKLIGHT, AND DISPLAY DEVICE

(71) Applicant: Xiamen Tianma Microelectronics Co., Ltd., Xiamen (CN)

(72) Inventors: Liu Wang, Xiamen (CN); Jian Liu, Xiamen (CN); Zhijie Wang, Xiamen (CN); Shumao Wu, Xiamen (CN); Guochang Lai, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/076,018

(22) Filed: Dec. 6, 2022

(30) Foreign Application Priority Data

Jun. 23, 2022 (CN) .......................... 202210724583.7

(51) Int. Cl.
G02F 1/00 (2006.01)
G02F 1/1335 (2006.01)
G02F 1/13357 (2006.01)
H05K 1/11 (2006.01)

(52) U.S. Cl.
CPC .. *G02F 1/133612* (2021.01); *G02F 1/133603* (2013.01); *H05K 1/111* (2013.01); *H05K 2201/09409* (2013.01); *H05K 2201/10106* (2013.01)

(58) Field of Classification Search
CPC .......... H05K 2201/09409; H05K 2201/10106; H05K 1/111; G02F 1/133612; G02F 1/133603
See application file for complete search history.

(56) References Cited

U.S. PATENT DOCUMENTS

| | | | |
|---|---|---|---|
| 11,042,238 B1* | 6/2021 | Zhang | G06V 40/1318 |
| 2022/0069062 A1* | 3/2022 | Kwon | G09F 9/3026 |
| 2022/0102476 A1* | 3/2022 | Kim | H10K 59/1213 |
| 2022/0130747 A1* | 4/2022 | Wang | H01L 23/49838 |
| 2022/0206656 A1* | 6/2022 | Park | G06F 3/04166 |
| 2022/0223679 A1* | 7/2022 | Kim | G09G 3/006 |
| 2023/0082959 A1* | 3/2023 | Jeong | G09G 3/32 |

FOREIGN PATENT DOCUMENTS

| | | |
|---|---|---|
| CN | 110649059 A | 1/2020 |
| CN | 113066920 A | 7/2021 |

* cited by examiner

*Primary Examiner* — Gerald J Sufleta, II

(74) *Attorney, Agent, or Firm* — KDW Firm PLLC

(57) ABSTRACT

Provided are a driving substrate, a backlight, and a display device. The driving substrate includes a plurality of backlight partitions arranged in an array. Each of the plurality of backlight partitions is provided with a first pad set column and a second pad set column, where the first pad set column and the second pad set column comprise arranged along a first direction and each include a plurality of pad sets arranged along a second direction, where the first direction intersects with the second direction. A boundary on one side of the first pad set column facing away from the second pad set column is denoted as a first boundary, and a boundary on one side of the second pad set column facing away from the first pad set column is denoted as a second boundary.

21 Claims, 18 Drawing Sheets

DRIVING SUBSTRATE, BACKLIGHT, AND DISPLAY DEVICE

CROSS-REFERENCE TO RELATED APPLICATION(S)

This application claims priority to Chinese Patent Application No. 202210724583.7 filed Jun. 23, 2022, the disclosure of which is incorporated herein by reference in its entirety.

TECHNICAL FIELD

The present disclosure relates to the field of display techniques and, in particular, to a driving substrate, a backlight, and a display device.

BACKGROUND

At present, the application penetration rate of light-emitting diodes (LEDs) as a backlight in the field of liquid crystal panel display has exceeded 90%. The backlight module includes two main types of structures, which include an edge-lit LED backlight and a direct-type LED backlight. In the edge-lit LED backlight, a LED light source is disposed on one side of a light guide plate, and the light emitted by the LED is coupled into the light guide plate and guided to the outside through the reflection and scattering of the reflective sheet and dots. The disadvantage is that the contrast of a resulting picture is relatively poor and local dimming is not possible. Capable of presenting an image more accurately and showing excellent color and light-dark contrast effects, the direct-type LED backlight has gradually become the mainstream trend in the market.

The direct-type LED backlight module generally includes a printed circuit broad (PCB), and a number of packaged LED chips are disposed on the PCB. The light emitted by the LED chips irradiates a liquid crystal display screen, so as to illuminate the liquid crystal display screen.

When the LED is applied to the backlight, the wiring between a pad set and a power line in an LED driving substrate squeezes the space of the power line and limit the line width of the power line.

SUMMARY

The present disclosure provides a driving substrate, a backlight, and a display device, so as to reduce an occupied area of a space where a power line is located and increase a line width of the power line.

In a first aspect, an embodiment of the present disclosure provides a driving substrate including a plurality of backlight partitions arranged in an array.

Each of the plurality of backlight partitions is provided with a first pad set column and a second pad set column, where the first pad set column and the second pad set column are arranged along a first direction and each include a plurality of pad sets arranged along a second direction, where the first direction intersects with the second direction.

A boundary on one side of the first pad set column facing away from the second pad set column is denoted as a first boundary, and a boundary on one side of the second pad set column facing away from the first pad set column is denoted as a second boundary.

Each of the plurality of pad sets includes a first pad and a second pad arranged along the second direction.

Each of the plurality of backlight partitions is provided with first connection lines, and each of the first connection lines connects the first pad and the second pad that are disposed in two of the plurality of pad sets, respectively.

In a same backlight partition among the plurality of backlight partitions, along the first direction, the first connection lines are disposed between the first boundary and the second boundary.

In a second aspect, an embodiment of the present disclosure provides a backlight. The backlight includes the driving substrate described in the first aspect and a plurality of light-emitting diodes, where each of the light-emitting diodes includes an anode and a cathode, the anode is electrically connected to the first pad, and the cathode is electrically connected to the second pad.

In a third aspect, an embodiment of the present disclosure provides a display device. The display device includes the backlight described in the second aspect and a display panel.

Embodiments of the present disclosure provide the driving substrate. The first connection line connecting two pad sets is disposed between the first boundary and the second boundary, and the first connection lines are not disposed on one side of the first pad set column facing away from the second pad set column and are not disposed on one side of the second pad set column facing away from the first pad set column, so as to reduce the occupied area of the space where the power line is located, thereby increasing the line width of the power line, reducing the impedance of the power line, reducing a voltage drop on the power line, and improving the brightness uniformity at each position.

DETAILED DESCRIPTION

Figure 1:
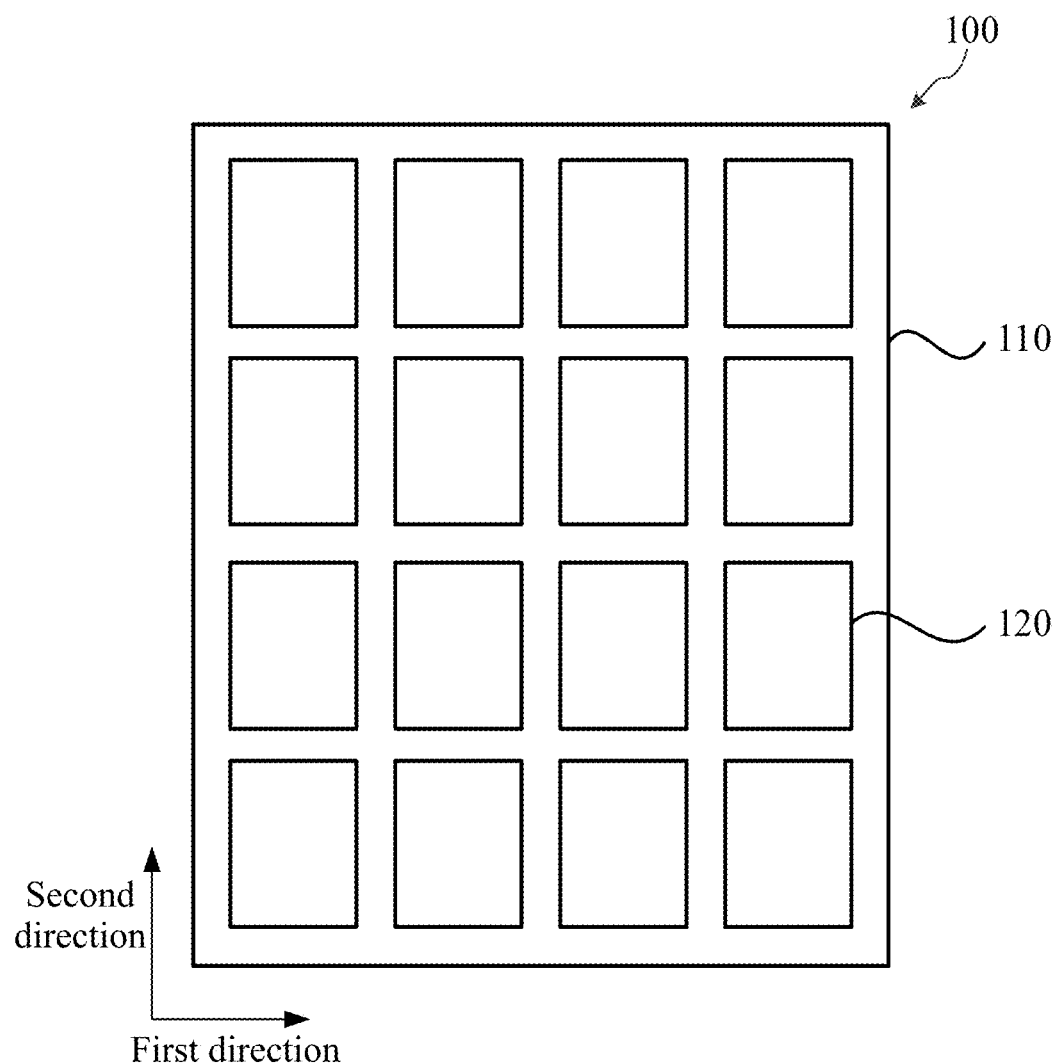
FIG. 1 is a top view of a driving substrate according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

Figure 2:
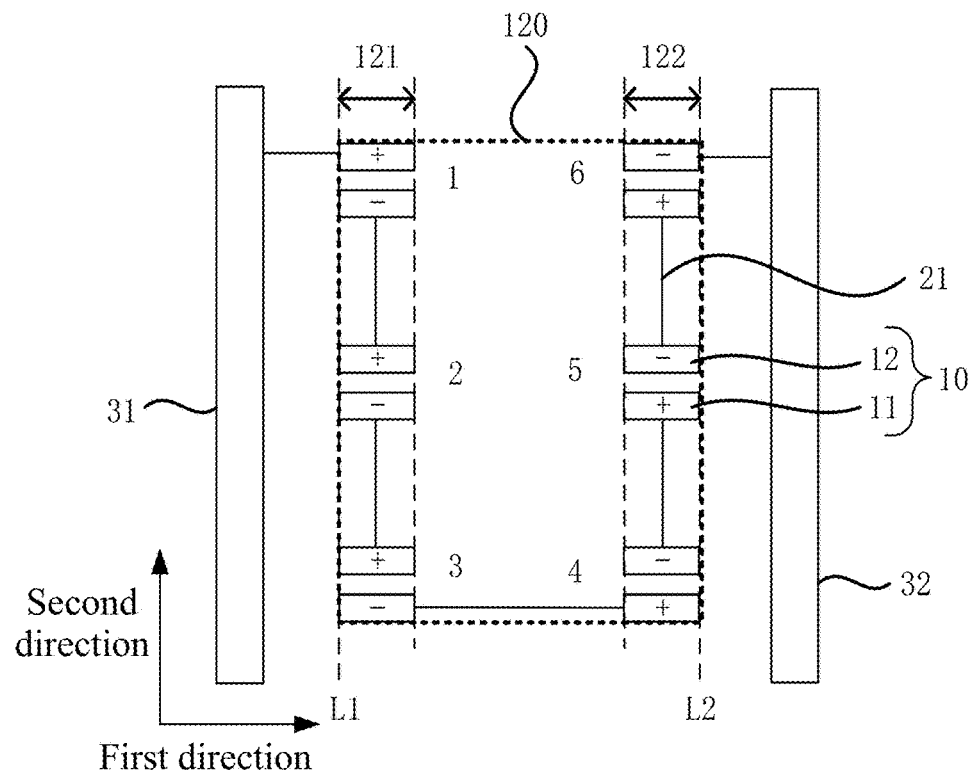
FIG. 2 is a top view of a backlight partition according to an embodiment of the present disclosure.

FIG. 1 is a top view of a driving substrate according to an embodiment of the present disclosure, and FIG. 2 is a top view of a backlight partition according to an embodiment of the present disclosure. Referring to FIGS. 1 and 2, a driving substrate 100 includes multiple backlight partitions 120 arranged in an array. The backlight partition 120 is provided with a first pad set column 121 and a second pad set column 122, where the first pad set column 121 and the second pad set column 122 are arranged along a first direction. Each of the first pad set column 121 and the second pad set column 122 includes multiple pad sets 10 arranged along a second direction. In the backlight partition 120, a part of pad sets 10 form the first pad set column 121 along the second direction, and a part of pad sets 10 form the second pad set column 122 along the second direction. The first direction intersects with the second direction. In an embodiment, the first direction and the second direction may be perpendicular to each other. In another embodiment, the first direction and the second direction may not be perpendicular to each other and have an included angle greater than 0° and less than 90°.

A boundary on one side of the first pad set column 121 facing away from the second pad set column 122 is denoted as a first boundary L1, and a boundary on one side of the second pad set column 122 facing away from the first pad set column 121 is denoted as a second boundary L2. The pad set 10 includes a first pad 11 and a second pad 12 arranged along the second direction. The backlight partition 120 is provided with first connection lines 21, and the first connection line 21 connects the first pad 11 and the second pad 12 that are disposed in two pad sets 10, respectively. That is, an end of the first connection line 21 is electrically connected to the first pad 11 of one pad set 10, and the other end of the first connection line 21 is electrically connected to the second pad 12 of the other pad set 10. Alternatively, an end of the first connection line 21 is electrically connected to the second pad 12 of one pad set 10, and the other end of the first connection line 21 is electrically connected to the first pad 11 of the other pad set 10. In the same backlight partition 120, along the first direction, the first connection lines 21 are located between the first boundary L1 and the second boundary L2.

The embodiments of the present disclosure provide the driving substrate. The first connection line 21 connecting two pad sets 10 is disposed between the first boundary L1 and the second boundary L2, and the first connection lines 21 are not disposed on one side of the first pad set column 121 facing away from the second pad set column 122 and are not disposed on one side of the second pad set column 122 facing away from the first pad set column 121, so as to reduce the occupied area of the space where the power line is located, thereby increasing the line width of the power line, reducing the impedance of the power line, reducing the voltage drop on the power line, and improving the brightness uniformity at each position.

By way of example, referring to FIG. 1, multiple backlight partitions 120 are arranged in an array along the first direction and the second direction. In other embodiments, the multiple backlight partitions 120 may also be arranged in an array along other directions.

By way of example, referring to FIG. 2, the power line in the driving substrate may include a first power line 31 and a second power line 32. The first power line 31 is disposed on one side of the first pad set column 121 facing away from the second pad set column 122. The second power line 32 is disposed on one side of the second pad set column 122 facing away from the first pad set column 121. Since the first connection lines 21 are located between the first boundary L1 and the second boundary L2, the first connection lines 21 are not disposed between the first pad set column 121 and the first power line 31 and not disposed between the second pad set column 122 and the second power line 32, thereby reducing the occupied area of the space where the first power line 31 and the second power line 32 are located, increasing the line width of the first power line 31 and the second power line 32, and reducing the impedance of the first power line 31 and the second power line 32.

By way of example, referring to FIG. 2, the pad sets 10 in the same backlight partition 120 are connected in series to form a pad set group. The pad set group includes a first connection terminal and a second connection terminal. The first connection terminal of the pad set group is electrically connected to the first power line 31, and the second connection terminal of the pad set group is electrically connected to the second power line 32. The first power line 31 and the second power line 32 provide operating voltages or operating currents for the multiple pad sets connected in series in the pad set group.

If the first connection line 21 disposed between the first pad set column 121 and the second pad set column 122 extends along the first direction, in the case where a distance between the first pad set column 121 and the second pad set column 122 is reduced, the first connection line 21 may be shortened along the first direction so that the first connection line 21 disposed between the first pad set column 121 and the second pad set column 122 and extending along the first direction does not occupy the space along the first direction. If the first connection line 21 disposed between the first pad set column 121 and the second pad set column 122 extends along the second direction, in the case where the distance between the first pad set column 121 and the second pad set column 122 is reduced, due to the limitation of a line width of the first connection line 21 and that spaces need to be reserved between the first connection line 21 and the first pad set column 121 and between the first connection line 21 and the second pad set column 122, the first connection line 21 does not have unnecessary electrical connection with the first pad set column 121 and/or the second pad set column 122. Therefore, the first connection line 21 disposed between the first pad set column 121 and the second pad set column 122 and extending along the second direction occupies the space along the first direction.

Optionally, referring to FIG. 2, in the same backlight partition 120, the first connection line 21 disposed between two pad sets 10 arranged along the first direction extends along the first direction. The first connection line 21 extending along the second direction is not disposed between the two pad sets 10 arranged along the first direction. The occupied area of the space where the power line is located is reduced, thereby increasing the line width of the power line and reducing the impedance of the power line.

For ease of understanding, in the multiple embodiments of the present disclosure, six pad sets 10 are used as examples for explanation, but not limited thereto. The present disclosure does not limit the number of pad sets 10.

By way of example, referring to FIG. 2, multiple pad sets 10 in the first pad set column 121 are a first pad set 1, a second pad set 2, and a third pad set 3 arranged along an opposite direction of the second direction, respectively. Multiple pad sets 10 in the second pad set column 122 are a fourth pad set 4, a fifth pad set 5, and a sixth pad set 6 arranged along the second direction, respectively. Along the first direction, the first connection line 21 is not disposed between the first pad set 1 and the sixth pad set 6 and not disposed between the second pad set 2 and the fifth pad set 5, and the first connection line 21 disposed between the third pad set 3 and the fourth pad set 4 extends along the first direction. The first connection line 21 disposed between the third pad set 3 and the fourth pad set 4 does not occupy the space along the first direction, so as to reduce the occupied area of the space where the power line is located, thereby increasing the line width of the power line and reducing the impedance of the power line.

If the first connection line 21 disposed between two pad sets 10 (or two pad set rows, where the pad set row includes multiple pad sets 10 arranged along the first direction) arranged along the second direction extends along the second direction, in the case where the distance between the two pad sets 10 (or the two pad set rows) arranged along the second direction is reduced, the first connection line 21 may be shortened along the second direction so that the first connection line 21 disposed between the two pad sets 10 (or the two pad set rows) arranged along the second direction and extending along the second direction does not occupy the space along the second direction. If the first connection line 21 disposed between two pad sets 10 (or two pad set rows, where the pad set row includes multiple pad sets 10 arranged along the first direction) arranged along the second direction extends along the first direction, in the case where the distance between the two pad sets 10 (or the two pad set rows) arranged along the second direction is reduced, due to the limitation of the line width of the first connection line 21 and that a space needs to be reserved between the first connection line 21 and the pad sets 10 (or the pad set rows), the first connection line 21 does not have unnecessary electrical connection with the pad sets 10 (or the pad set rows). Therefore, the first connection line 21 disposed between the two pad sets (or the two pad set rows) arranged along the second direction and extending along the first direction occupies the space along the second direction.

By way of example, referring to FIG. 2, the first connection line 21 disposed between the first pad set 1 and the second pad set 2 extends along the second direction, the first connection line 21 disposed between the second pad set 2 and the third pad set 3 extends along the second direction, the first connection line 21 disposed between the fourth pad set 4 and the fifth pad set extends along the second direction, and the first connection line 21 disposed between the fifth pad set 5 and the sixth pad set extends along the second direction. The first connection lines 21 do not occupy the space along the second direction.

Optionally, referring to FIG. 2, in the pad set 10 of the first pad set column 121, the first pad 11 is disposed on one side of the second pad 12 facing the second direction. In the pad set 10 of the second pad set column 122, the second pad 12 is disposed on one side of the first pad 11 facing the second direction. An arrangement direction of the first pad 11 and the second pad 12 in the pad set 10 disposed in the first pad set column 121 is opposite to an arrangement direction of the first pad 11 and the second pad 12 in the pad set 10 disposed in the second pad set column 122. The advantage of such an arrangement is that all the pad sets 10 may be connected one after another in sequence. Therefore, the first connection line 21 extending along the second direction is not disposed between two pad sets 10 arranged along the first direction so that the first connection line 21 does not occupy the space along the first direction; the first connection line 21 extending along the first direction is not disposed between two pad sets 10 arranged along the second direction so that the first connection line 21 does not occupy the space along the second direction; the first connection lines 21 have the same or similar lengths and evenly distributed, which is conducive to wiring and reducing the electrical difference between the first connection lines 21.

By way of example, referring to FIG. 2, the first pad set 1, the second pad set 2, the third pad set 3, the fourth pad set 4, the fifth pad set 5, and the sixth pad set 6 are sequentially connected in series. Sequential connection in series refers to the first pad 11 of the previous pad set is connected to the second pad 12 of the next pad set in sequence, or the second pad 12 of the previous pad set is connected to the first pad 11 of the next pad set in sequence. As shown in FIG. 2, the connection relationship of the pad sets is as follows: the second pad 12 of the first pad set 1 is electrically connected to the first pad 11 of the second pad set 2 through the first connection line 21, the second pad 12 of the second pad set 2 is electrically connected to the first pad 11 of the third pad set 3 through the first connection line 21, the second pad 12 of the third pad set 3 is electrically connected to the first pad 11 of the fourth pad set 4 through the first connection line 21, the second pad 12 of the fourth pad set 4 is electrically connected to the first pad 11 of the fifth pad set 5 through the first connection line 21, and the second pad 12 of the fifth pad set 5 is electrically connected to the first pad 11 of the sixth pad set 6 through the first connection line 21.

Figure 3:
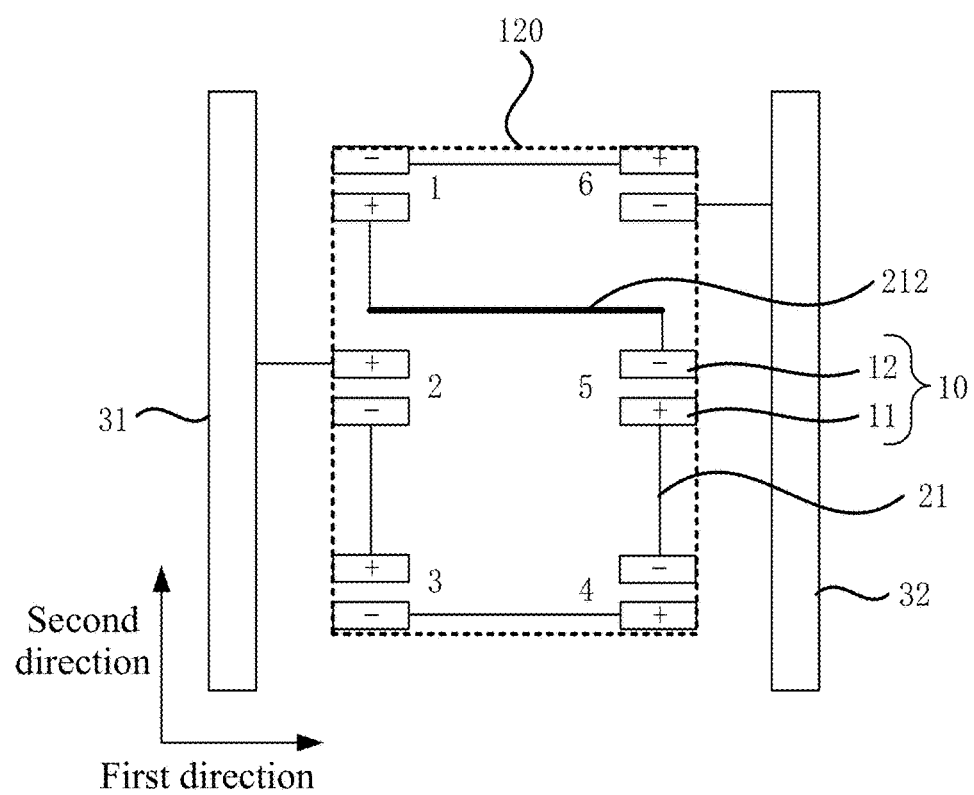
FIG. 3 is a top view of another backlight partition according to an embodiment of the present disclosure.

FIG. 3 is a top view of another backlight partition according to an embodiment of the present disclosure. Referring to FIG. 3, the second pad set 2, the third pad set 3, the fourth pad set 4, the fifth pad set 5, the first pad set 1, and the sixth pad set 6 are sequentially connected in series. Among the first pad set 1, the fourth pad set 4, and the fifth pad set 5, the second pad 12 is disposed on one side of the first pad 11 facing the second direction. Among the second pad set 2, the third pad set 3, and the sixth pad set 6, the first pad 11 is disposed on one side of the second pad 12 facing the second direction. In the embodiment of the present disclosure, the first connection line 21 extending along the second direction is not disposed between two pad sets 10 arranged along the first direction so that the first connection line 21 does not occupy the space along the first direction. One first connection line 21 extending along the first direction is disposed between two pad sets 10 arranged along the second direction so that the first connection line 21 occupies a relatively small space along the second direction.

By way of example, referring to FIG. 3, the first connection line 21 disposed between the two pad sets 10 arranged along the second direction includes a second sub-line segment 212, and the second sub-line segment 212 extends along the first direction. The backlight partition 120 is provided with one second sub-line segment 212, where the second sub-line segment 212 is disposed between the first pad set 1 and the second pad set 2, or the second sub-line segment 212 is disposed between the fifth pad set 5 and the sixth pad set 6.

Figure 4:
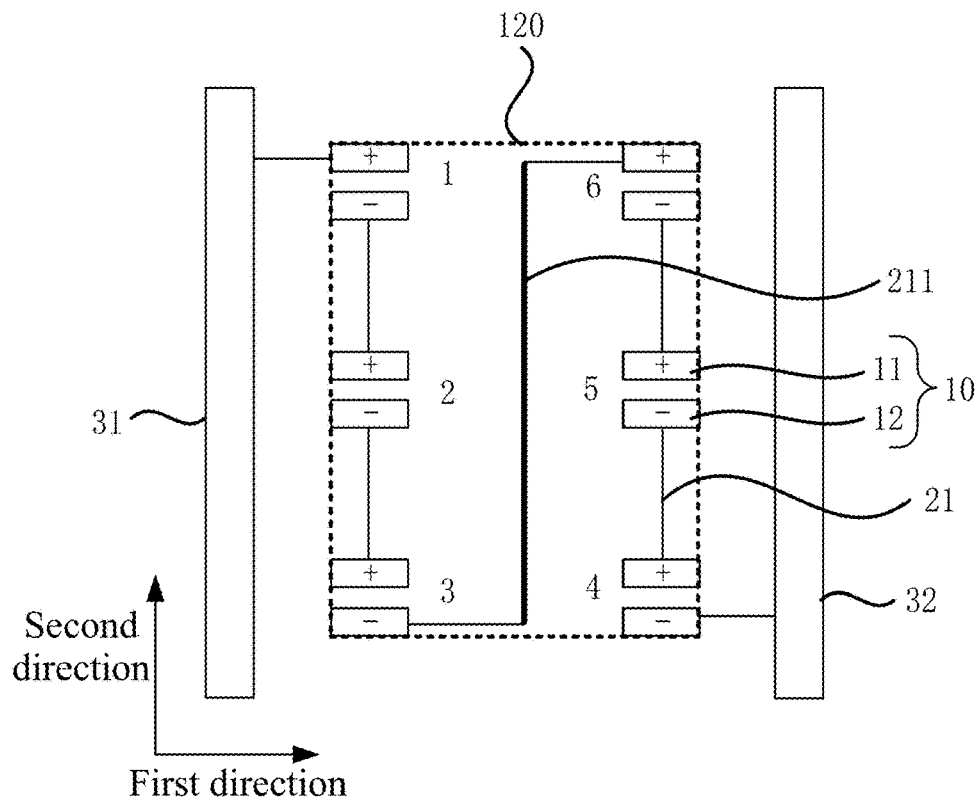
FIG. 4 is a top view of another backlight partition according to an embodiment of the present disclosure.

FIG. 4 is a top view of another backlight partition according to an embodiment of the present disclosure. Referring to FIG. 4, the first connection line 21 disposed between two pad sets arranged along the first direction includes a first sub-line segment 211, and the first sub-line segment 211 extends along the second direction. One backlight partition 120 is provided with one first sub-line segment 211. One first sub-line segment 211 occupies a relatively small space along the first direction.

Optionally, referring to FIG. 4, the first connection line 21 disposed between two pad sets 10 arranged along the second direction extends along the second direction. The first connection line 21 disposed between the two pad sets 10 arranged along the second direction and extending along the second direction does not occupy the space along the second direction.

Optionally, referring to FIG. 4, the first pad set 1, the second pad set 2, the third pad set 3, the sixth pad set 6, the fifth pad set 5, and the fourth pad set 4 are sequentially connected in series. In the embodiment of the present disclosure, one first sub-line segment 211 is disposed between the two pad sets 10 arranged along the first direction and occupies a relatively small space along the first direction. The first connection line 21 extending along the first direction is not disposed between the two pad sets 10 arranged along the second direction so that the first connection line 21 does not occupy the space along the second direction.

Figure 5:
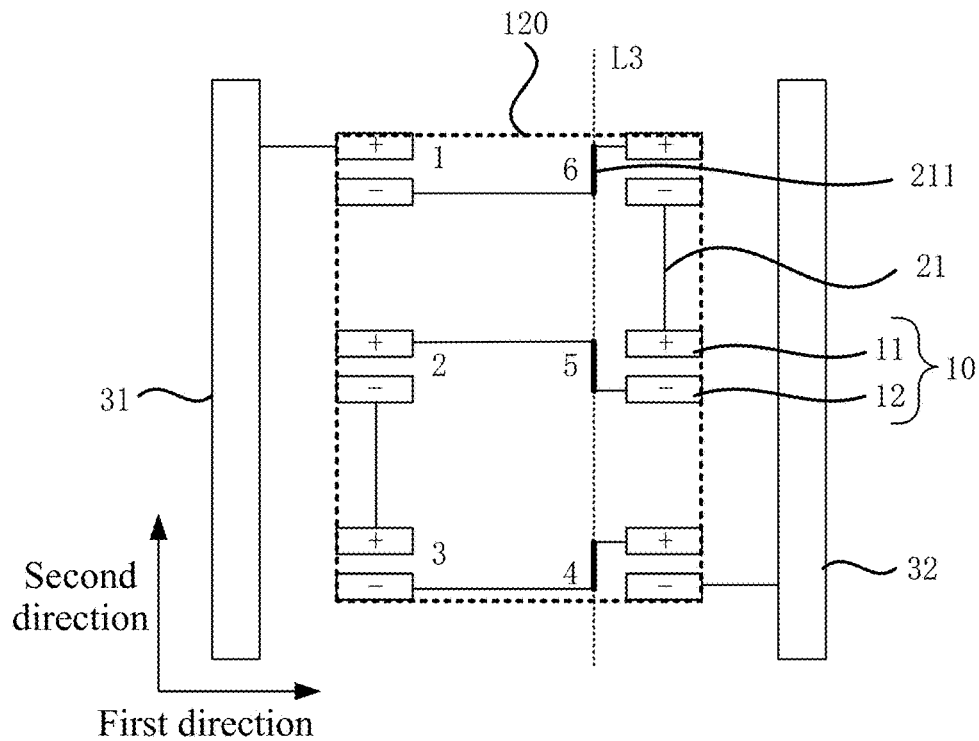
FIG. 5 is a top view of another backlight partition according to an embodiment of the present disclosure.

FIG. 5 is a top view of another backlight partition according to an embodiment of the present disclosure. Referring to FIG. 5, one backlight partition 120 is provided with multiple first sub-line segments 211 disposed on a same straight line L3. It is to be understood that the multiple first sub-line segments 211 disposed on the same straight line L3 occupy the same space along the first direction, and the multiple first sub-line segments 211 occupy the same space along the first direction as one first sub-line segment 211 so that the occupied space along the first direction is relatively small.

Optionally, referring to FIG. 5, the first pad set 1, the sixth pad set 6, the fifth pad set 5, the second pad set 2, the third pad set 3, and the fourth pad set 4 are sequentially connected in series. In the embodiment of the present disclosure, one first sub-line segment 211 is disposed between two pad sets 10 arranged along the first direction, and three collinear first sub-line segments 211 are disposed in the backlight partition 120 and occupy the same space along the first direction as one first sub-line segment 211 so that the occupied space along the first direction is relatively small. The first connection line 21 extending along the first direction is not disposed between two pad sets 10 arranged along the second direction so that the first connection line 21 does not occupy the space along the second direction.

By way of example, referring to FIG. 5, the first sub-line segment 211 between the first pad set 1 and the sixth pad set 6, the first sub-line segment 211 between the second pad set 2 and the fifth pad set 5, and the first sub-line segment 211 between the third pad set 3 and the fourth pad set 4 are disposed on the same straight line L3 and occupy the same space along the first direction as one first sub-line segment 211 so that the occupied space along the first direction is relatively small.

Figure 6:
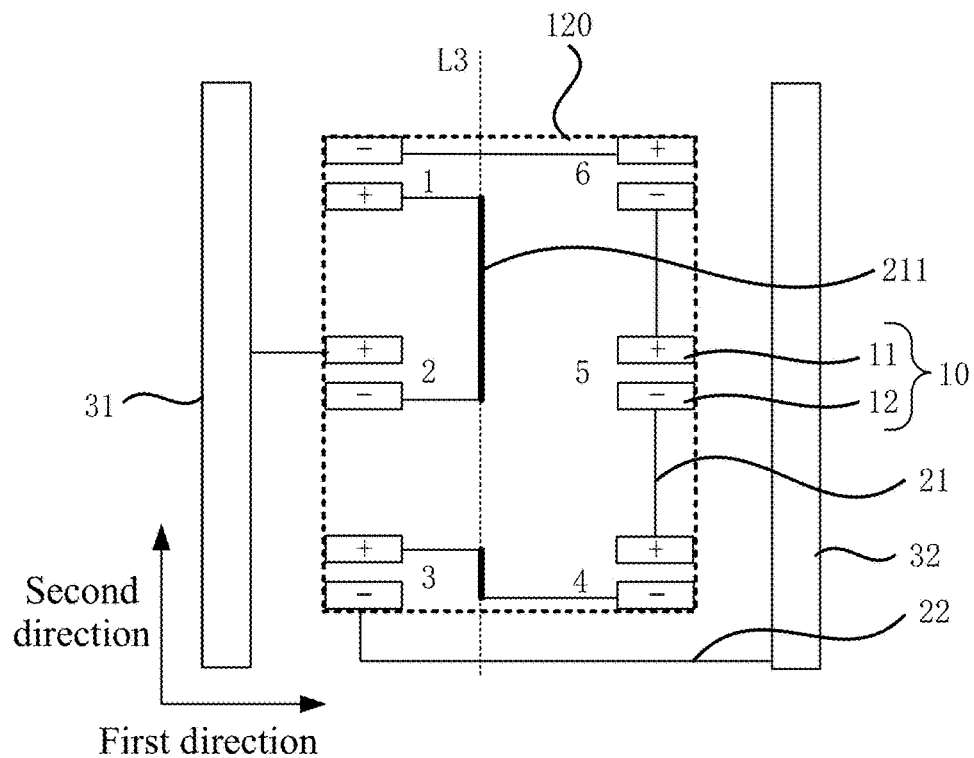
FIG. 6 is a top view of another backlight partition according to an embodiment of the present disclosure.

FIG. 6 is a top view of another backlight partition according to an embodiment of the present disclosure. Referring to FIG. 6, the second pad set 2, the first pad set 1, the sixth pad set 6, the fifth pad set 5, the fourth pad set 4, and the third pad set 3 are sequentially connected in series. In the first pad set 1, the second pad 12 is disposed on one side of the first pad 11 facing the second direction. Among the second pad set 2, the third pad set 3, the fourth pad set 4, the fifth pad set 5, and the sixth pad set 6, the first pad 11 is disposed on one side of the second pad 12 facing the second direction. In the embodiment of the present disclosure, one first sub-line segment 211 is disposed between two pad sets 10 arranged along the first direction, and two collinear first sub-line segments 211 are disposed in the backlight partition 120 and occupy the same space along the first direction as one first sub-line segment 211 so that the occupied space along the first direction is relatively small. The first connection line 21 extending along the first direction is not disposed between two pad sets 10 arranged along the second direction so that the first connection line 21 does not occupy the space along the second direction.

By way of example, referring to FIG. 6, the first sub-line segment 211 between the first pad set 1 and the second pad set 2 and the first sub-line segment 211 between the third pad set 3 and the fourth pad set 4 are disposed on the same straight line L3 and occupy the same space along the first direction as one first sub-line segment 211 so that the occupied space along the first direction is relatively small.

Figure 7:
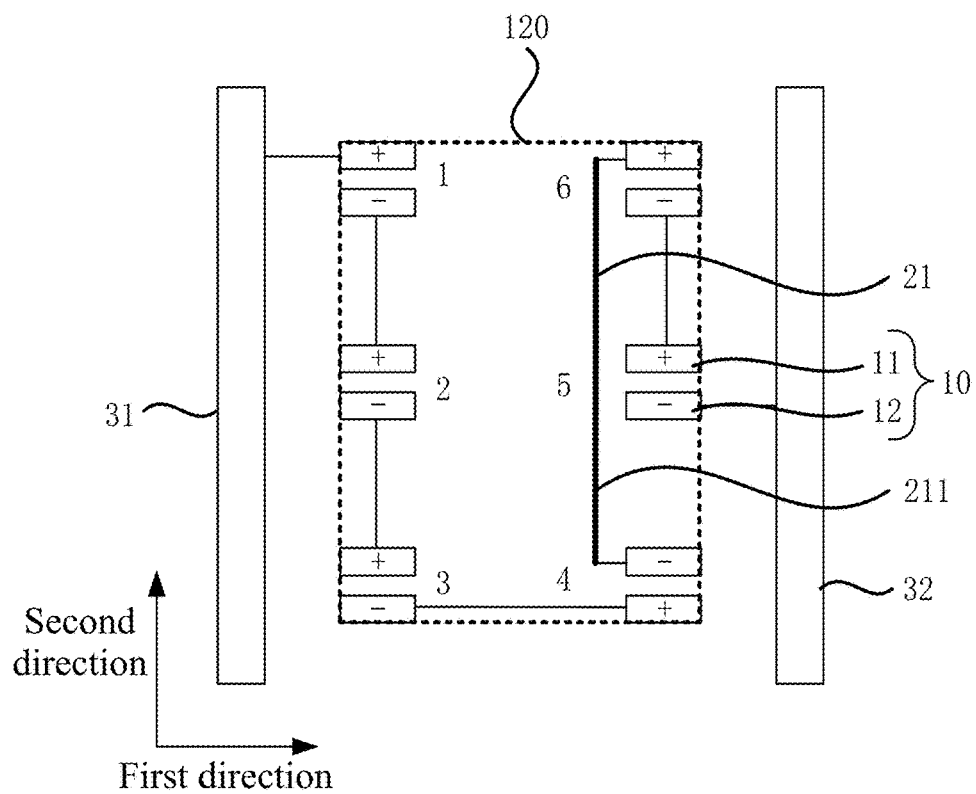
FIG. 7 is a top view of another backlight partition according to an embodiment of the present disclosure.

FIG. 7 is a top view of another backlight partition according to an embodiment of the present disclosure. Referring to FIG. 7, the first pad set 1, the second pad set 2, the third pad set 3, the fourth pad set 4, the sixth pad set 6, and the fifth pad set 5 are sequentially connected in series. In the fourth pad set 4, the second pad 12 is disposed on one side of the first pad 11 facing the second direction. Among the first pad set 1, the second pad set 2, the third pad set 3, the fifth pad set 5, and the sixth pad set 6, the first pad 11 is disposed on one side of the second pad 12 facing the second direction. In the embodiment of the present disclosure, one first sub-line segment 211 is disposed between the two pad sets 10 arranged along the first direction and occupies a relatively small space along the first direction. The first connection line 21 extending along the first direction is not disposed between two pad sets 10 arranged along the second direction so that the first connection line 21 does not occupy the space along the second direction.

Figure 8:
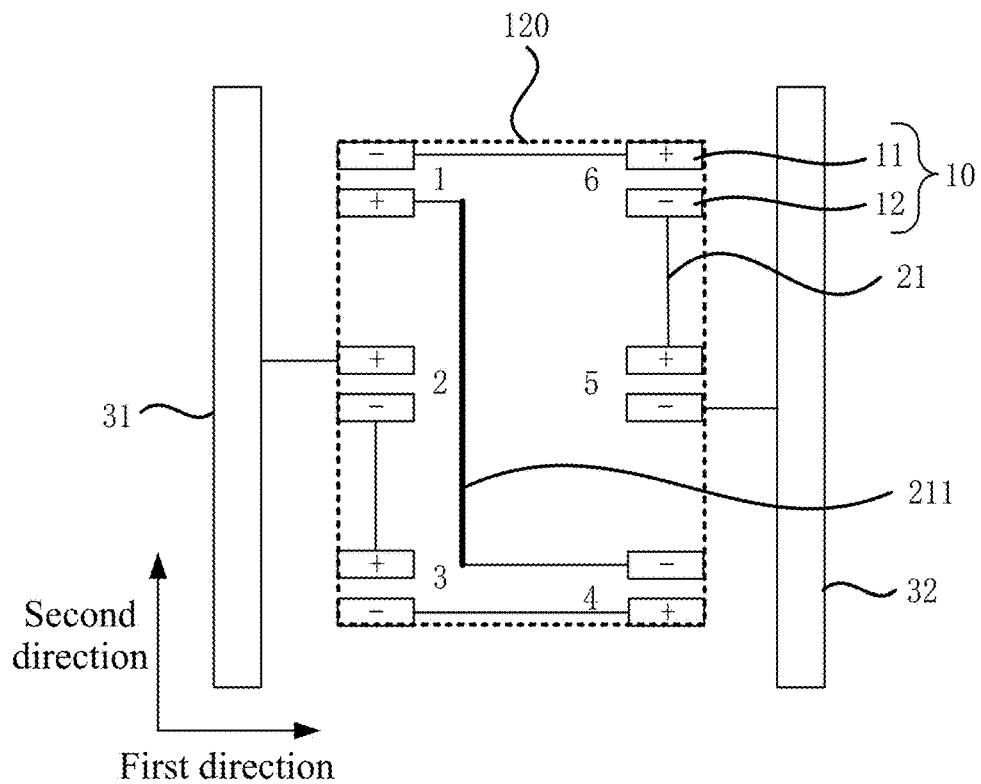
FIG. 8 is a top view of another backlight partition according to an embodiment of the present disclosure.

FIG. 8 is a top view of another backlight partition according to an embodiment of the present disclosure. Referring to FIG. 8, the second pad set 2, the third pad set 3, the fourth pad set 4, the first pad set 1, the sixth pad set 6, and the fifth pad set 5 are sequentially connected in series. Among the first pad set 1 and the fourth pad set 4, the second pad 12 is disposed on one side of the first pad 11 facing the second direction. Among the second pad set 2, the third pad set 3, the fifth pad set 5, and the sixth pad set 6, the first pad 11 is disposed on one side of the second pad 12 facing the second direction. In the embodiment of the present disclosure, one first sub-line segment 211 is disposed between the two pad sets 10 arranged along the first direction and occupies a relatively small space along the first direction. The first connection line 21 extending along the first direction is not disposed between two pad sets 10 arranged along the second direction so that the first connection line 21 does not occupy the space along the second direction.

Figure 9:
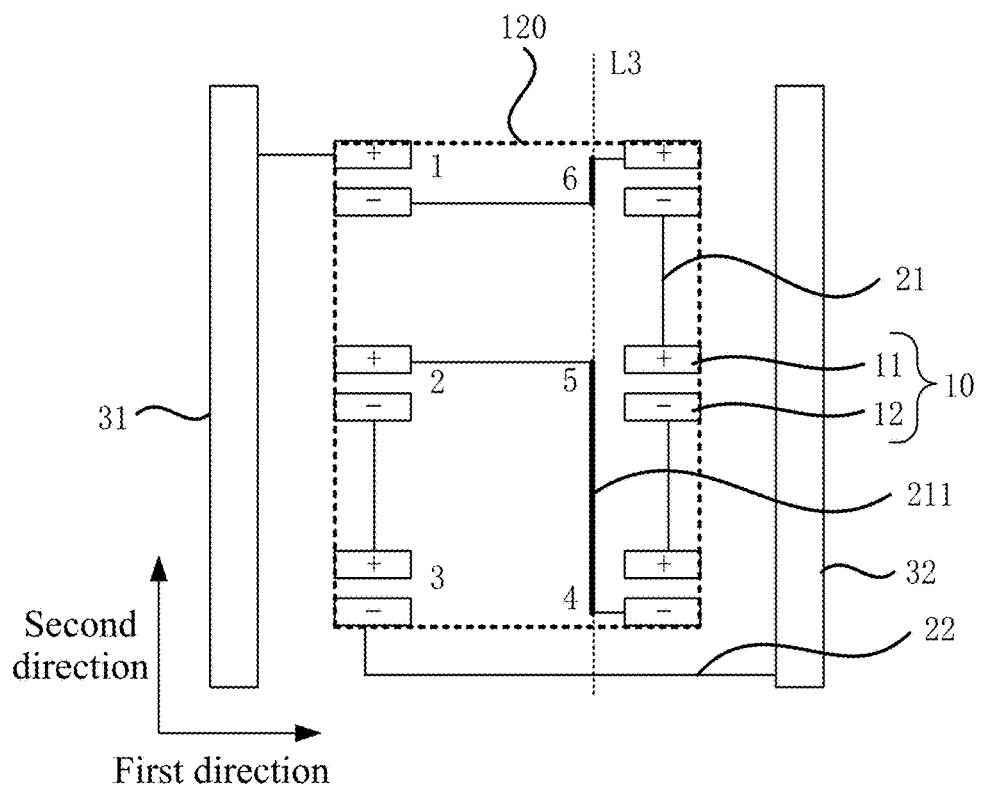
FIG. 9 is a top view of another backlight partition according to an embodiment of the present disclosure.

FIG. 9 is a top view of another backlight partition according to an embodiment of the present disclosure. Referring to FIG. 9, the first pad set 1, the sixth pad set 6, the fifth pad set 5, the fourth pad set 4, the second pad set 2, and the third pad set 3 are sequentially connected in series. In the embodiment of the present disclosure, one first sub-line segment 211 is disposed between two pad sets 10 arranged along the first direction, and two collinear first sub-line segments 211 are disposed in the backlight partition 120 and occupy the same space along the first direction as one first sub-line segment 211 so that the occupied space along the first direction is relatively small. The first connection line 21 extending along the first direction is not disposed between two pad sets 10 arranged along the second direction so that the first connection line 21 does not occupy the space along the second direction.

By way of example, referring to FIG. 9, the first sub-line segment 211 between the first pad set 1 and the sixth pad set 6 and the first sub-line segment 211 between the second pad set 2 and the fourth pad set 4 are disposed on the same straight line L3 and occupy the same space along the first direction as one first sub-line segment 211 so that the occupied space along the first direction is relatively small.

Figure 10:
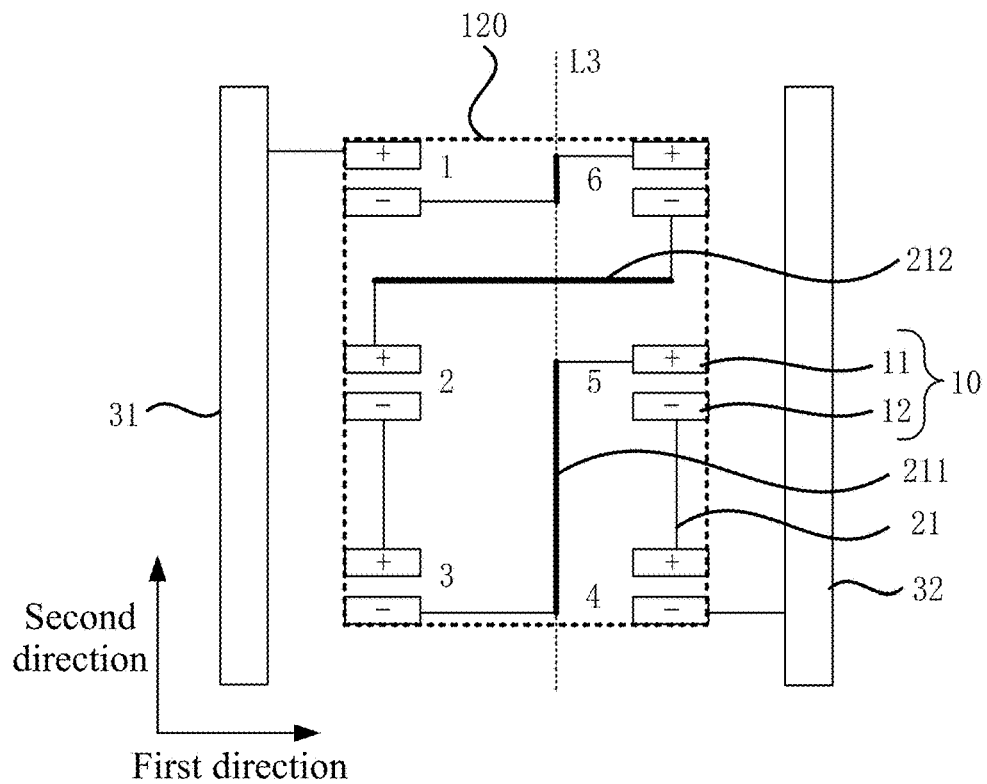
FIG. 10 is a top view of another backlight partition according to an embodiment of the present disclosure.

FIG. 10 is a top view of another backlight partition according to an embodiment of the present disclosure. Referring to FIG. 10, the first connection line 21 disposed between two pad sets 10 arranged along the second direction includes a second sub-line segment 212, and the second sub-line segment 212 extends along the first direction. The backlight partition 120 is provided with one second sub-line segment 212. One second sub-line segment 212 occupies a relatively small space along the second direction.

Optionally, referring to FIG. 10, the first pad set 1, the sixth pad set 6, the second pad set 2, the third pad set 3, the fifth pad set 5, and the fourth pad set 4 are sequentially connected in series. In the embodiment of the present disclosure, one first sub-line segment 211 is disposed between two pad sets 10 arranged along the first direction, and two collinear first sub-line segments 211 are disposed in the backlight partition 120 and occupy the same space along the first direction as one first sub-line segment 211 so that the occupied space along the first direction is relatively small. One second sub-line segment 212 is disposed between two pad sets 10 arranged along the second direction and occupies a relatively small space along the second direction.

By way of example, referring to FIG. 10, the first sub-line segment 211 between the first pad set 1 and the sixth pad set 6 and the first sub-line segment 211 between the third pad set 3 and the fifth pad set 5 are disposed on the same straight line L3 and occupy the same space along the first direction as one first sub-line segment 211 so that the occupied space along the first direction is relatively small.

Figure 11:
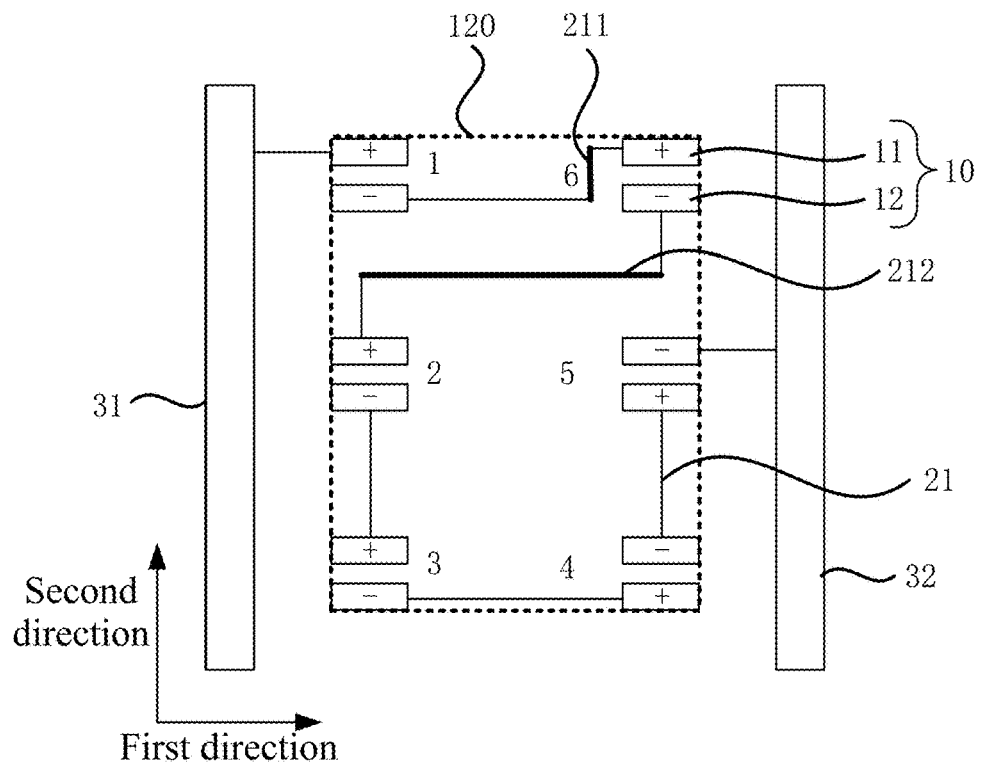
FIG. 11 is a top view of another backlight partition according to an embodiment of the present disclosure.

FIG. 11 is a top view of another backlight partition according to an embodiment of the present disclosure. Referring to FIG. 11, the first pad set 1, the sixth pad set 6, the second pad set 2, the third pad set 3, the fourth pad set 4, and the fifth pad set 5 are sequentially connected in series. Among the fourth pad set 4 and the fifth pad set 5, the second pad 12 is disposed on one side of the first pad 11 facing the second direction. Among the first pad set 1, the second pad set 2, the third pad set 3, and the sixth pad set 6, the first pad 11 is disposed on one side of the second pad 12 facing the second direction. In the embodiment of the present disclosure, one first sub-line segment 211 is disposed between the two pad sets 10 arranged along the first direction and occupies a relatively small space along the first direction. One second sub-line segment 212 is disposed between two pad sets 10 arranged along the second direction and occupies a relatively small space along the second direction.

Figure 12:
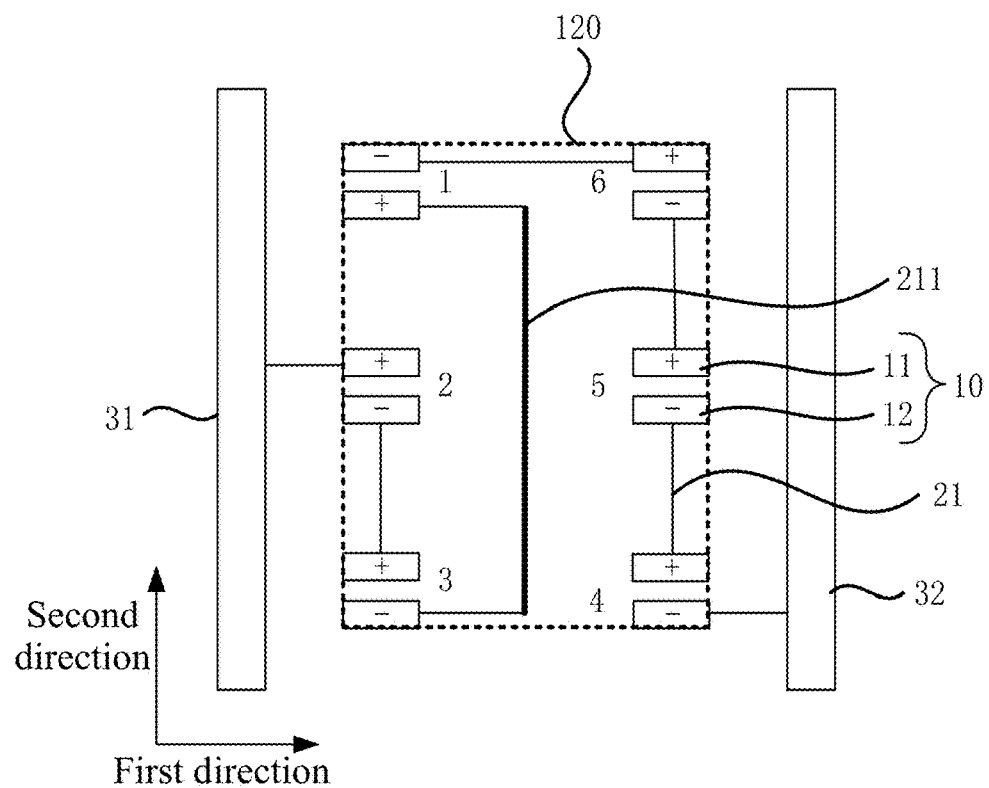
FIG. 12 is a top view of another backlight partition according to an embodiment of the present disclosure.

FIG. 12 is a top view of another backlight partition according to an embodiment of the present disclosure. Referring to FIG. 12, the second pad set 2, the third pad set 3, the first pad set 1, the sixth pad set 6, the fifth pad set 5, and the fourth pad set 4 are sequentially connected in series. In the first pad set 1, the second pad 12 is disposed on one side of the first pad 11 facing the second direction. Among the second pad set 2, the third pad set 3, the fourth pad set 4, the fifth pad set 5, and the sixth pad set 6, the first pad 11 is disposed on one side of the second pad 12 facing the second direction. In the embodiment of the present disclosure, one first sub-line segment 211 is disposed between the two pad sets 10 arranged along the first direction and occupies a relatively small space along the first direction. The first connection line 21 extending along the first direction is not disposed between two pad sets 10 arranged along the second direction so that the first connection line 21 does not occupy the space along the second direction.

Figure 13:
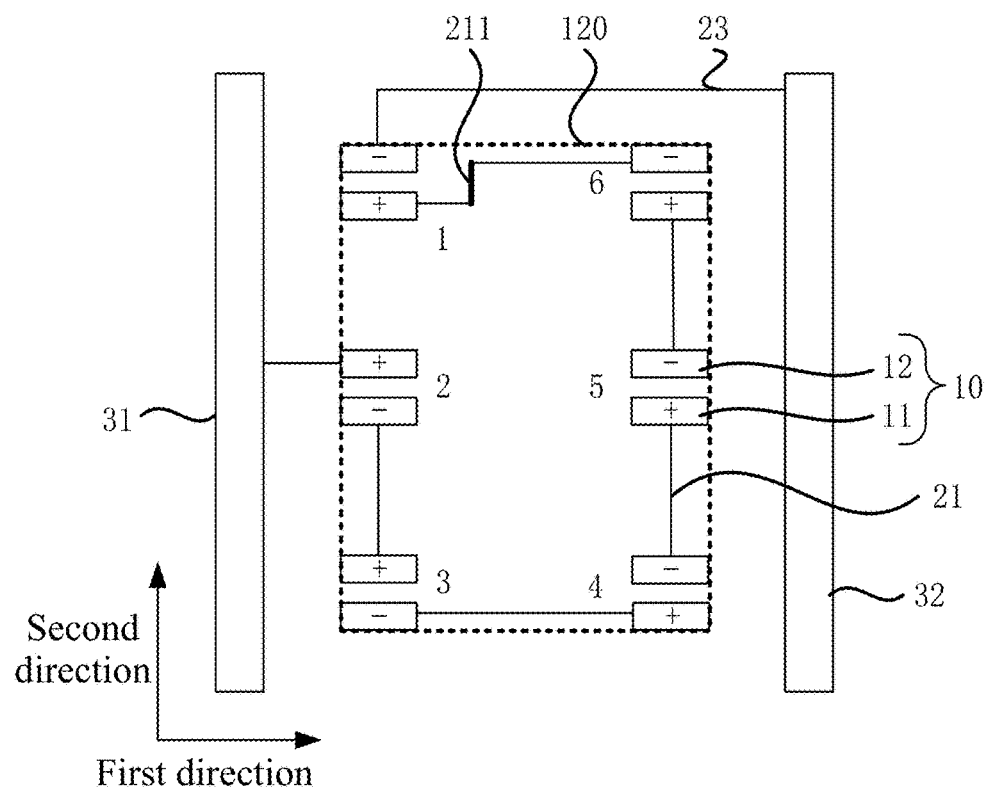
FIG. 13 is a top view of another backlight partition according to an embodiment of the present disclosure.

FIG. 13 is a top view of another backlight partition according to an embodiment of the present disclosure. Referring to FIG. 13, the second pad set 2, the third pad set 3, the fourth pad set 4, the fifth pad set 5, the sixth pad set 6, and the fifth pad set 1 are sequentially connected in series. Among the first pad set 1, the fourth pad set 4, the fifth pad set 5, and the sixth pad set 6, the second pad 12 is disposed on one side of the first pad 11 facing the second direction. Among the second pad set 2 and the third pad set 3, the first pad 11 is disposed on one side of the second pad 12 facing the second direction. In the embodiment of the present disclosure, one first sub-line segment 211 is disposed between the two pad sets 10 arranged along the first direction and occupies a relatively small space along the first direction. The first connection line 21 extending along the first direction is not disposed between two pad sets 10 arranged along the second direction so that the first connection line 21 does not occupy the space along the second direction.

Figure 14:
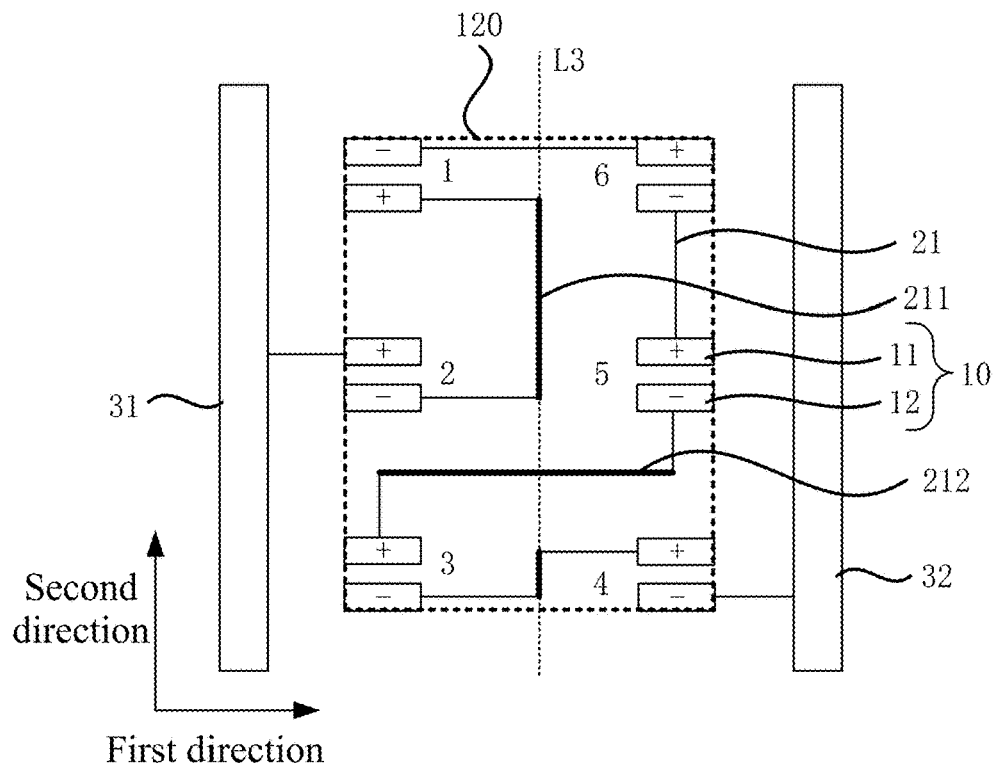
FIG. 14 is a top view of another backlight partition according to an embodiment of the present disclosure.

FIG. 14 is a top view of another backlight partition according to an embodiment of the present disclosure. Referring to FIG. 14, the second pad set 2, the first pad set 1, the sixth pad set 6, the fifth pad set 5, the third pad set 3, and the fourth pad set 4 are sequentially connected in series. In the first pad set 1, the second pad 12 is disposed on one side of the first pad 11 facing the second direction. Among the second pad set 2, the third pad set 3, the fourth pad set 4, the fifth pad set 5, and the sixth pad set 6, the first pad 11 is disposed on one side of the second pad 12 facing the second direction. In the embodiment of the present disclosure, one first sub-line segment 211 is disposed between two pad sets 10 arranged along the first direction, and two collinear first sub-line segments 211 are disposed in the backlight partition 120 and occupy the same space along the first direction as one first sub-line segment 211 so that the occupied space along the first direction is relatively small. One second sub-line segment 212 is disposed between two pad sets 10 arranged along the second direction and occupies a relatively small space along the second direction.

By way of example, referring to FIG. 14, the first sub-line segment 211 between the first pad set 1 and the second pad set 2 and the first sub-line segment 211 between the third pad set 3 and the fourth pad set 4 are disposed on the same straight line L3 and occupy the same space along the first direction as one first sub-line segment 211 so that the occupied space along the first direction is relatively small.

Figure 15:
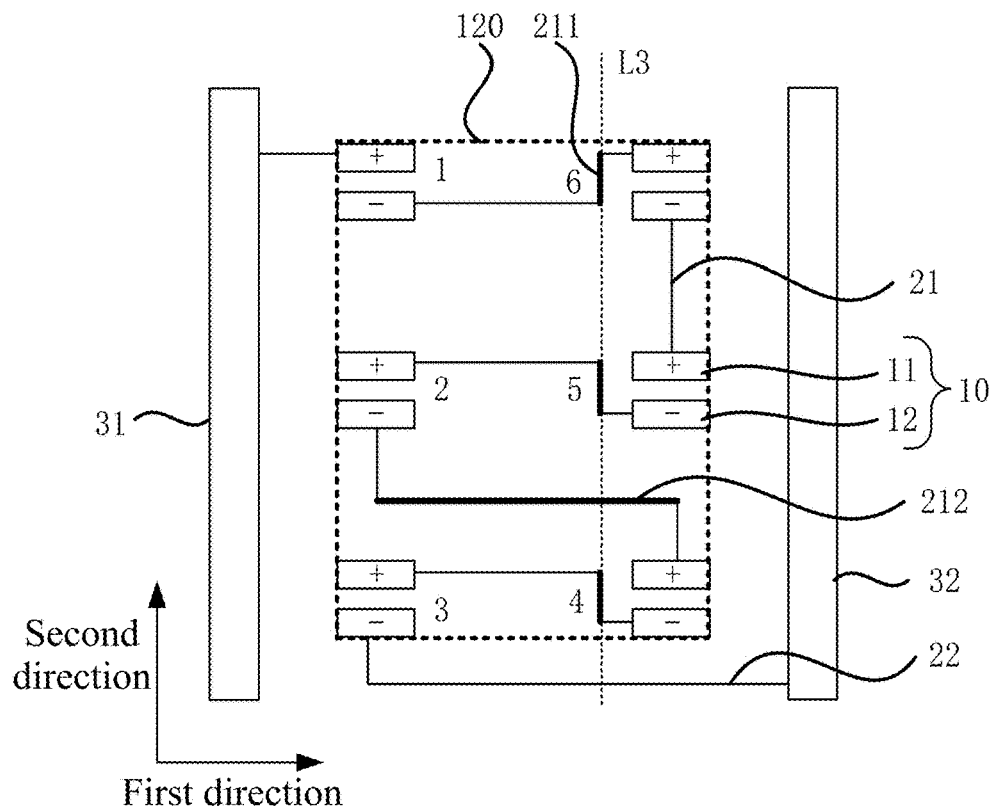
FIG. 15 is a top view of another backlight partition according to an embodiment of the present disclosure.

FIG. 15 is a top view of another backlight partition according to an embodiment of the present disclosure. Referring to FIG. 15, the first pad set 1, the sixth pad set 6, the fifth pad set 5, the second pad set 2, the fourth pad set 4, and the third pad set 3 are sequentially connected in series.

Figure 16:
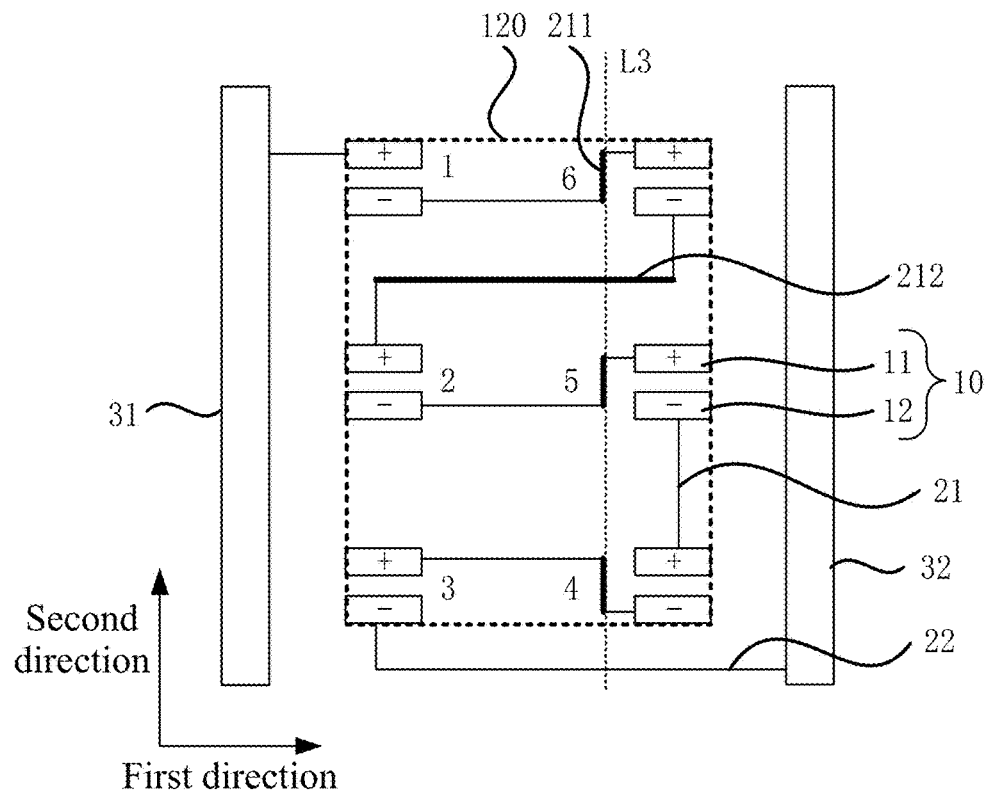
FIG. 16 is a top view of another backlight partition according to an embodiment of the present disclosure.

FIG. 16 is a top view of another backlight partition according to an embodiment of the present disclosure. Referring to FIG. 16, the first pad set 1, the sixth pad set 6, the second pad set 2, the fifth pad set 5, the fourth pad set 4, and the third pad set 3 are sequentially connected in series.

Figure 17:
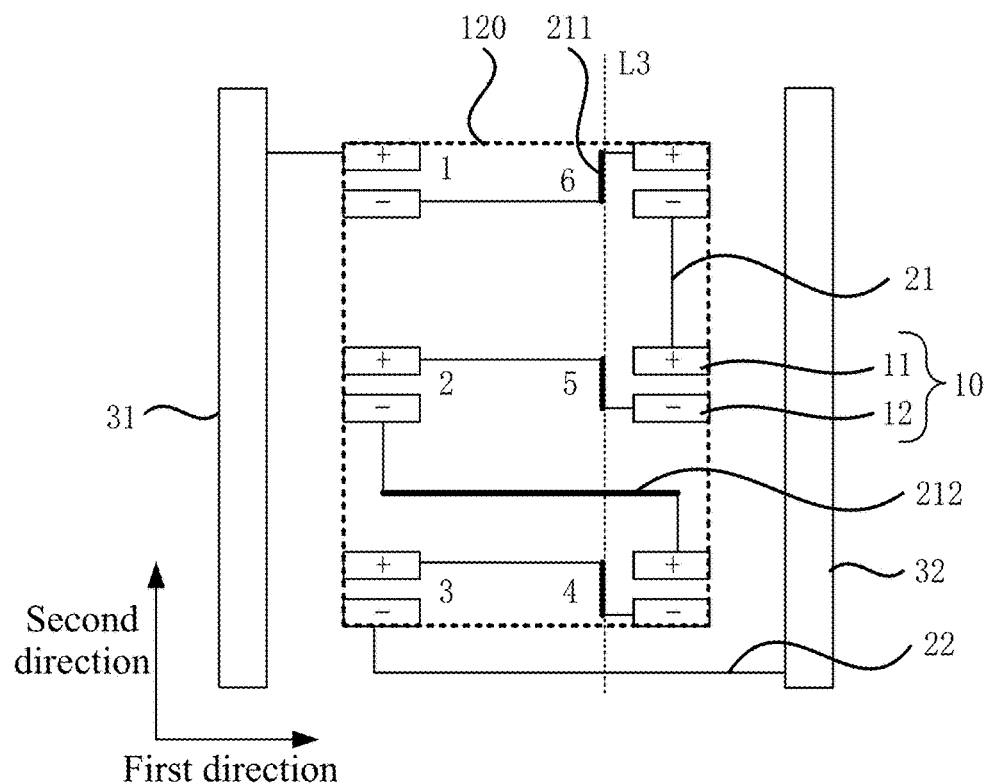
FIG. 17 is a top view of another backlight partition according to an embodiment of the present disclosure.

FIG. 17 is a top view of another backlight partition according to an embodiment of the present disclosure. Referring to FIG. 17, the first pad set 1, the sixth pad set 6, the fifth pad set 5, the second pad set 2, the fourth pad set 4, and the third pad set 3 are sequentially connected in series.

In the embodiments of the present disclosure as shown in FIGS. 15 to 17, one first sub-line segment 211 is disposed between two pad sets 10 arranged along the first direction, and three collinear first sub-line segments 211 are disposed in the backlight partition 120 and occupy the same space along the first direction as one first sub-line segment 211 so that the occupied space along the first direction is relatively small. One second sub-line segment 212 is disposed between two pad sets 10 arranged along the second direction and occupies a relatively small space along the second direction.

Figure 18:
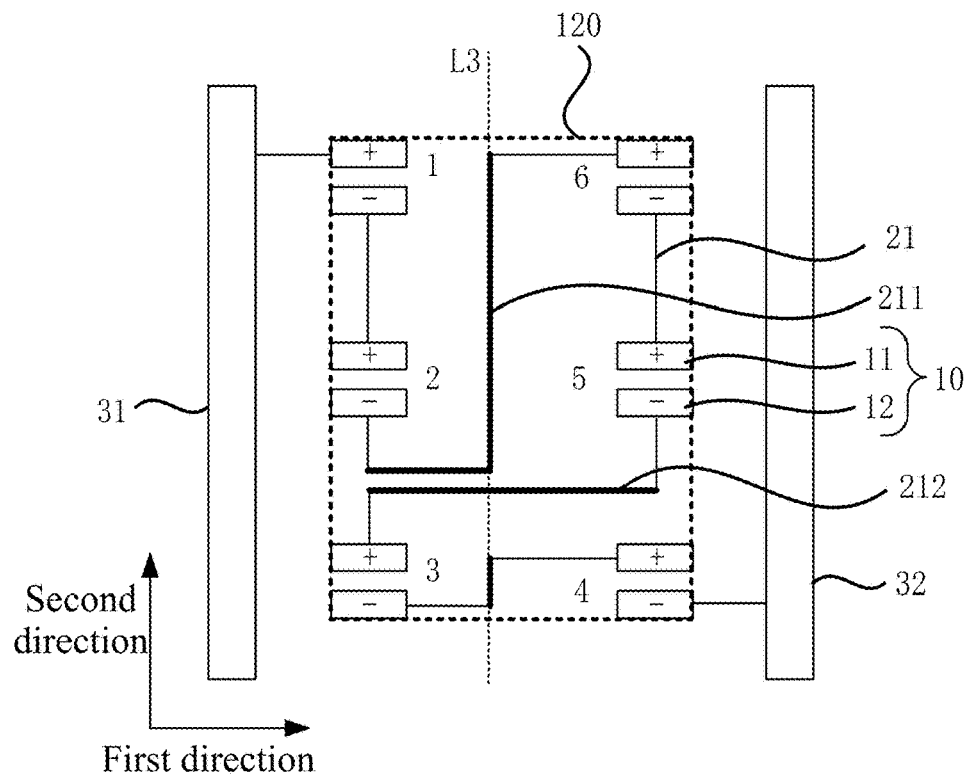
FIG. 18 is a top view of another backlight partition according to an embodiment of the present disclosure.

FIG. 18 is a top view of another backlight partition according to an embodiment of the present disclosure. Referring to FIG. 18, the backlight partition 120 is provided with two second sub-line segments 212 arranged along the second direction. Two second sub-line segments 212 occupy a relatively small space along the second direction.

Optionally, referring to FIG. 18, the first pad set 1, the second pad set 2, the sixth pad set 6, the fifth pad set 5, the third pad set 3, and the fourth pad set 4 are sequentially connected in series. In the embodiment of the present disclosure, one first sub-line segment 211 is disposed between two pad sets 10 arranged along the first direction, and two collinear first sub-line segments 211 are disposed in the backlight partition 120 and occupy the same space along the first direction as one first sub-line segment 211 so that the occupied space along the first direction is relatively small. Two second sub-line segments 212 are disposed in the backlight partition 120 and occupy a relatively small space along the second direction.

By way of example, referring to FIG. 18, the first sub-line segment 211 between the second pad set 2 and the sixth pad set 6 and the first sub-line segment 211 between the third pad set 3 and the fifth pad set 5 are disposed on the same straight line L3 and occupy the same space along the first direction as one first sub-line segment 211 so that the occupied space along the first direction is relatively small.

Figure 19:
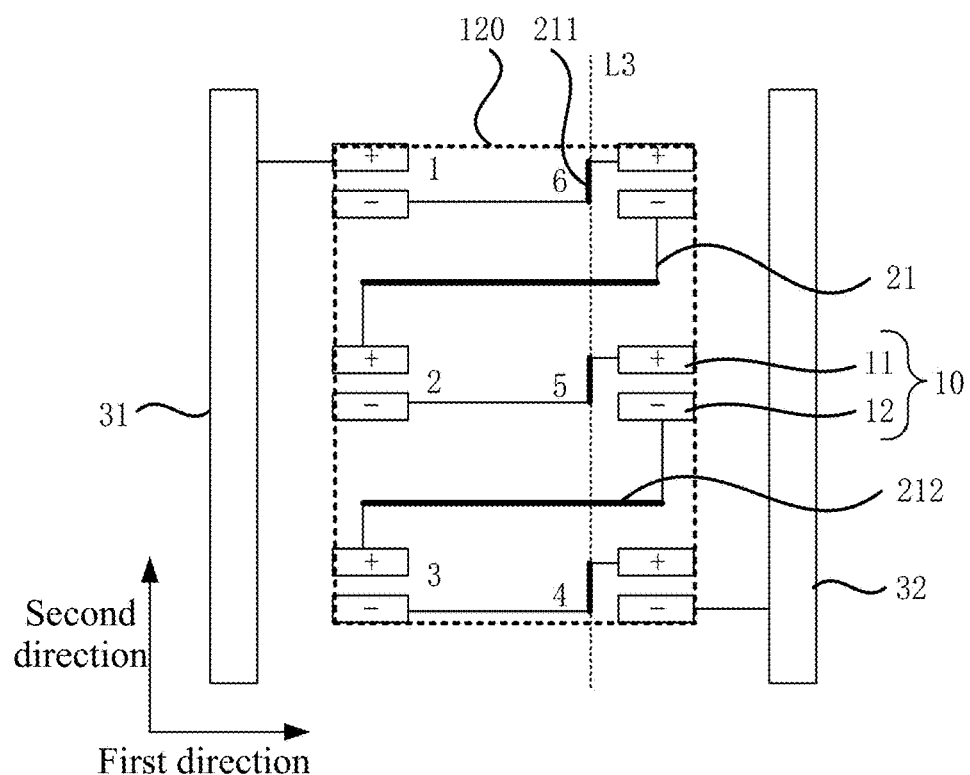
FIG. 19 is a top view of another backlight partition according to an embodiment of the present disclosure.

FIG. 19 is a top view of another backlight partition according to an embodiment of the present disclosure. Referring to FIG. 19, the first pad set 1, the sixth pad set 6, the second pad set 2, the fifth pad set 5, the third pad set 3, and the fourth pad set 4 are sequentially connected in series. In the embodiment of the present disclosure, one first sub-line segment 211 is disposed between two pad sets 10 arranged along the first direction, and three collinear first sub-line segments 211 are disposed in the backlight partition 120 and occupy the same space along the first direction as one first sub-line segment 211 so that the occupied space along the first direction is relatively small. Two second sub-line segments 212 are disposed in the backlight partition 120 and occupy a relatively small space along the second direction.

By way of example, referring to FIG. 19, the first sub-line segment 211 between the first pad set 1 and the sixth pad set 6, the first sub-line segment 211 between the second pad set 2 and the fifth pad set 5, and the first sub-line segment 211 between the third pad set 3 and the fourth pad set 4 are disposed on the same straight line L3 and occupy the same space along the first direction as one first sub-line segment 211 so that the occupied space along the first direction is relatively small.

Optionally, referring to any one of FIG. 4, 5, 9, 10, 15, 16, 17, 18, or 19, in any pad set 10, the first pad 11 is disposed on one side of the second pad 12 facing the second direction. Arrangement directions of the first pads 11 and the second pads 12 in all the pad sets 10 in the same backlight partition 120 are the same. The advantage of such an arrangement is that the difficulty of arrangement of the pad sets 10 is reduced.

In some embodiments, the connection line electrically connected to the pad set 10 may also be disposed on one side of the pad set group facing the second direction or on one side of the pad set group facing an opposite direction of the second direction.

Optionally, referring to any one of FIG. 6, 9, 15, 16, or 17, the driving substrate 100 further includes a second connection line 22, where the second connection line 22 is electrically connected to the second pad 12 in the third pad set 3. Along an opposite direction of the second direction, the second connection line 22 is disposed on one side of the third pad set 3 facing away from the first pad set 1.

Optionally, referring to FIG. 13, the driving substrate 100 further includes a third connection line 23, where the third connection line 23 is electrically connected to the second pad 12 in the first pad set 1. Along the second direction, the third connection line 23 is disposed on one side of the first pad set 1 facing away from the third pad set 3.

In some embodiments, one backlight partition 120 includes two first sub-line segments 211 that are not collinear and arranged in parallel.

Figure 20:
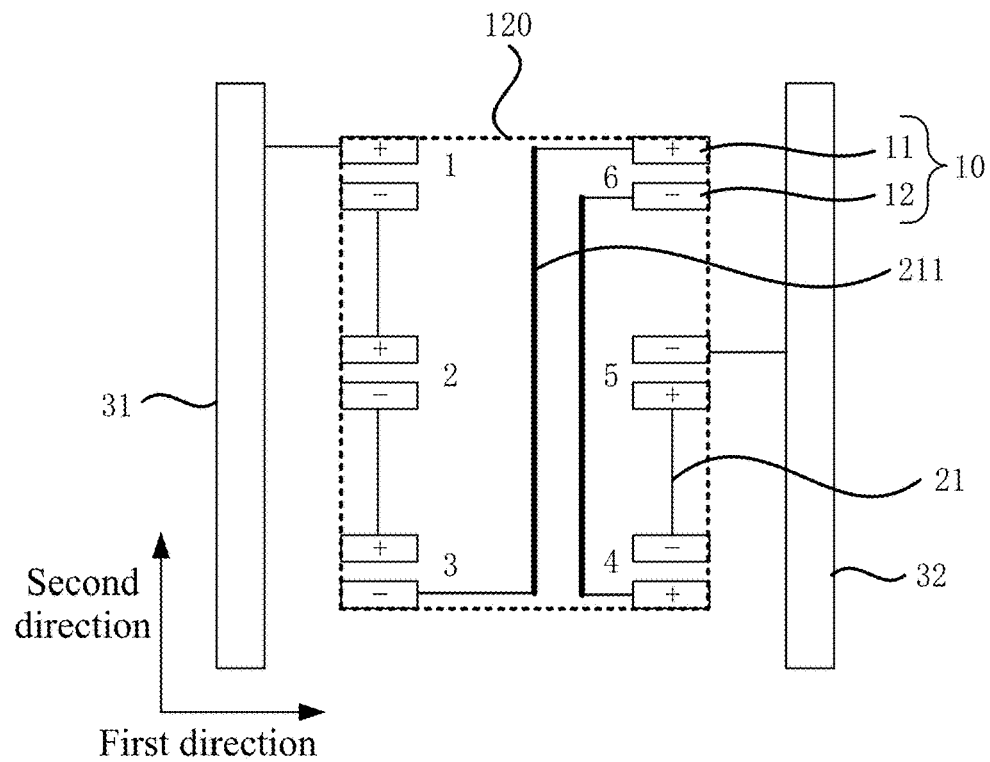
FIG. 20 is a top view of another backlight partition according to an embodiment of the present disclosure.

FIG. 20 is a top view of another backlight partition according to an embodiment of the present disclosure. Referring to FIG. 20, the first pad set 1, the second pad set 2, the third pad set 3, the sixth pad set 6, the fourth pad set 4, and the fifth pad set 5 are sequentially connected in series. Among the first pad set 1, the second pad set 2, the third pad set 3, and the sixth pad set 6, the first pad 11 is disposed on one side of the second pad 12 facing the second direction. Among the fourth pad set 4 and the fifth pad set 5, the second pad 12 is disposed on one side of the first pad 11 facing the second direction.

Figure 21:
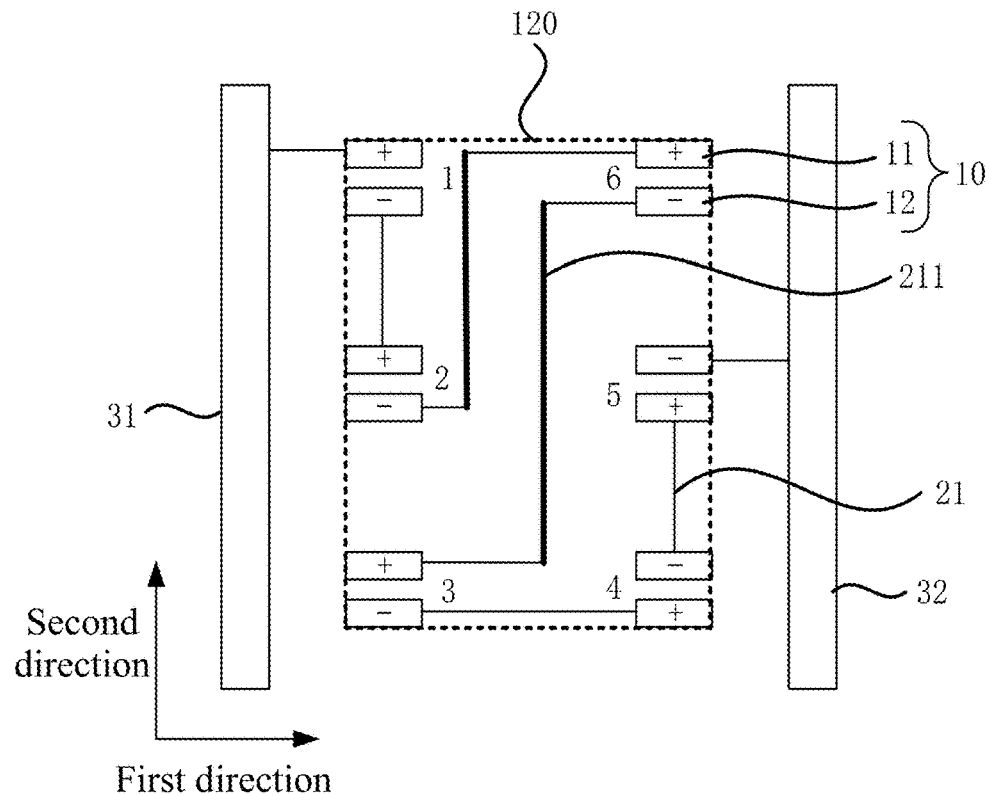
FIG. 21 is a top view of another backlight partition according to an embodiment of the present disclosure.

FIG. 21 is a top view of another backlight partition according to an embodiment of the present disclosure. Referring to FIG. 21, the first pad set 1, the second pad set 2, the sixth pad set 6, the third pad set 3, the fourth pad set 4, and the fifth pad set 5 are sequentially connected in series. Among the first pad set 1, the second pad set 2, the third pad set 3, and the sixth pad set 6, the first pad 11 is disposed on one side of the second pad 12 facing the second direction. Among the fourth pad set 4 and the fifth pad set 5, the second pad 12 is disposed on one side of the first pad 11 facing the second direction.

Figure 22:
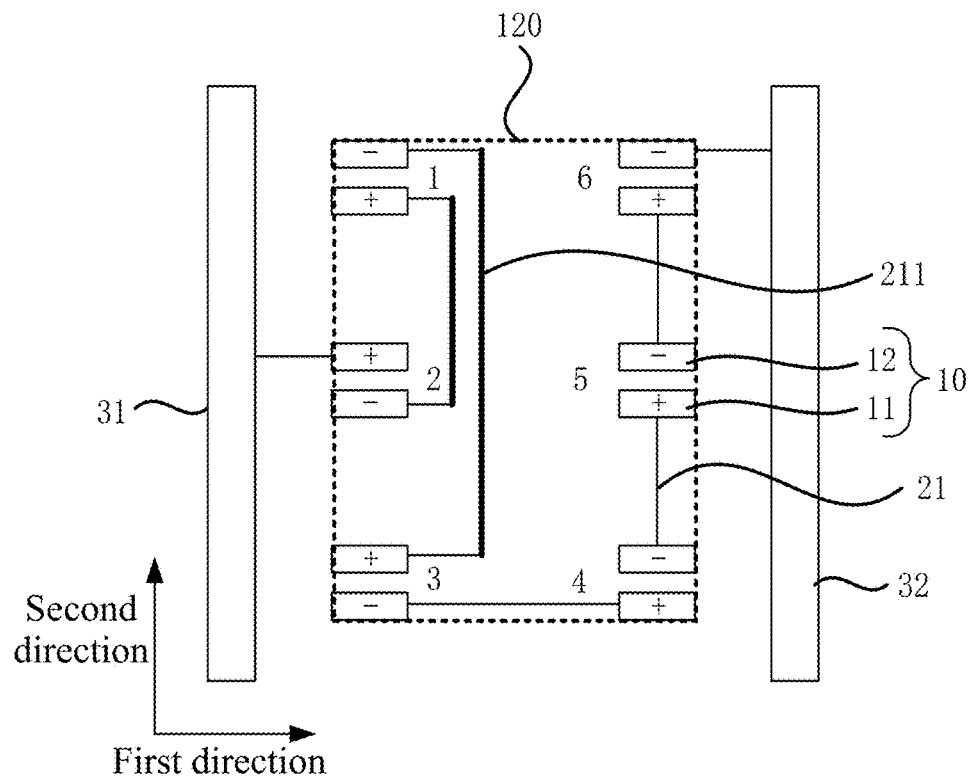
FIG. 22 is a top view of another backlight partition according to an embodiment of the present disclosure.

FIG. 22 is a top view of another backlight partition according to an embodiment of the present disclosure. Referring to FIG. 22, the second pad set 2, the first pad set 1, the third pad set 3, the fourth pad set 4, the fifth pad set 5, and the sixth pad set 6 are sequentially connected in series. Among the second pad set 2 and the third pad set 3, the first pad 11 is disposed on one side of the second pad 12 facing the second direction. Among the first pad set 1, the fourth pad set 4, the fifth pad set 5, and the sixth pad set 6, the second pad 12 is disposed on one side of the first pad 11 facing the second direction.

Figure 23:
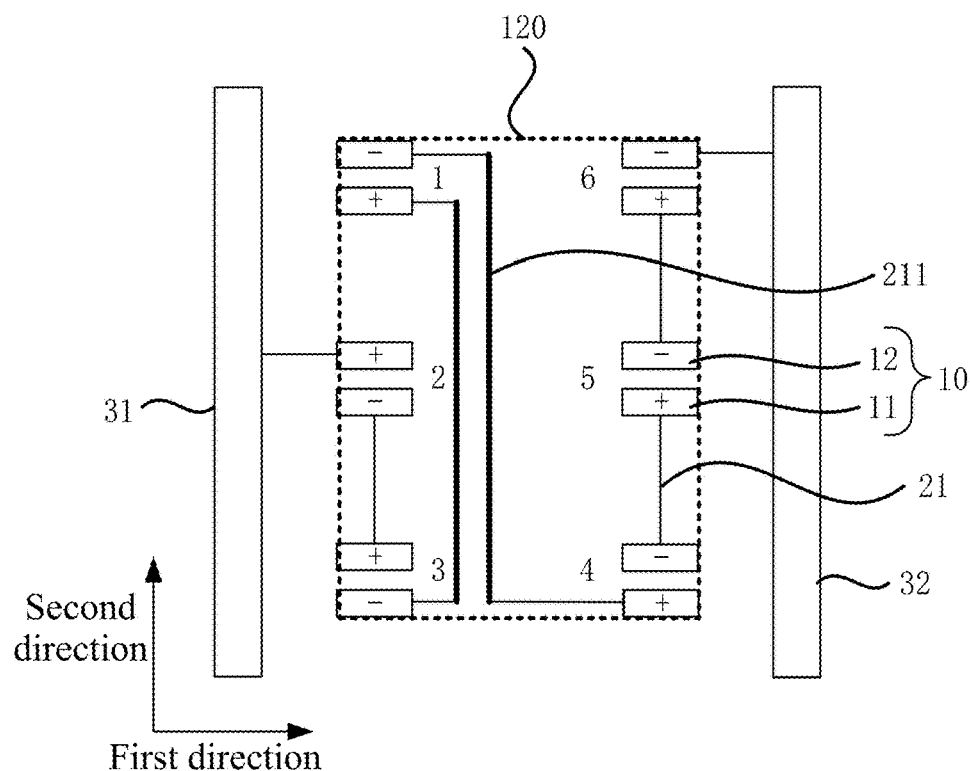
FIG. 23 is a top view of another backlight partition according to an embodiment of the present disclosure.

FIG. 23 is a top view of another backlight partition according to an embodiment of the present disclosure. Referring to FIG. 23, the second pad set 2, the third pad set 3, the first pad set 1, the fourth pad set 4, the fifth pad set 5, and the sixth pad set 6 are sequentially connected in series. Among the second pad set 2 and the third pad set 3, the first pad 11 is disposed on one side of the second pad 12 facing the second direction. Among the first pad set 1, the fourth pad set 4, the fifth pad set 5, and the sixth pad set 6, the second pad 12 is disposed on one side of the first pad 11 facing the second direction.

Figure 24:
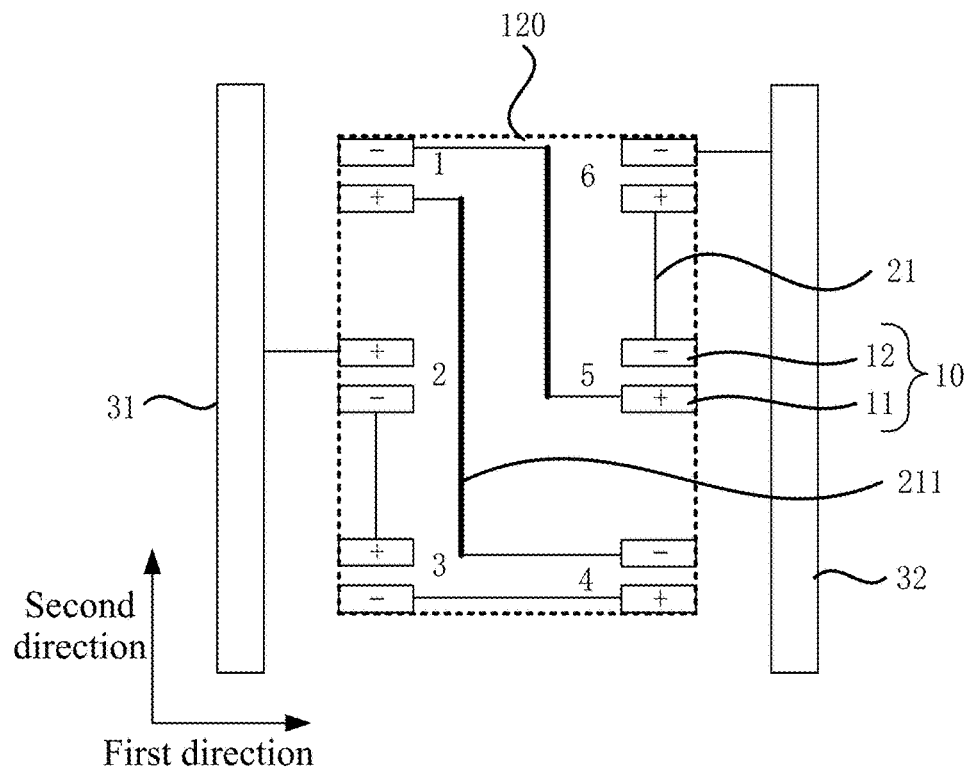
FIG. 24 is a top view of another backlight partition according to an embodiment of the present disclosure.

FIG. 24 is a top view of another backlight partition according to an embodiment of the present disclosure. Referring to FIG. 24, the second pad set 2, the third pad set 3, the fourth pad set 4, the first pad set 1, the fifth pad set 5, and the sixth pad set 6 are sequentially connected in series. Among the second pad set 2 and the third pad set 3, the first pad 11 is disposed on one side of the second pad 12 facing the second direction. Among the first pad set 1, the fourth pad set 4, the fifth pad set 5, and the sixth pad set 6, the second pad 12 is disposed on one side of the first pad 11 facing the second direction.

Figure 25:
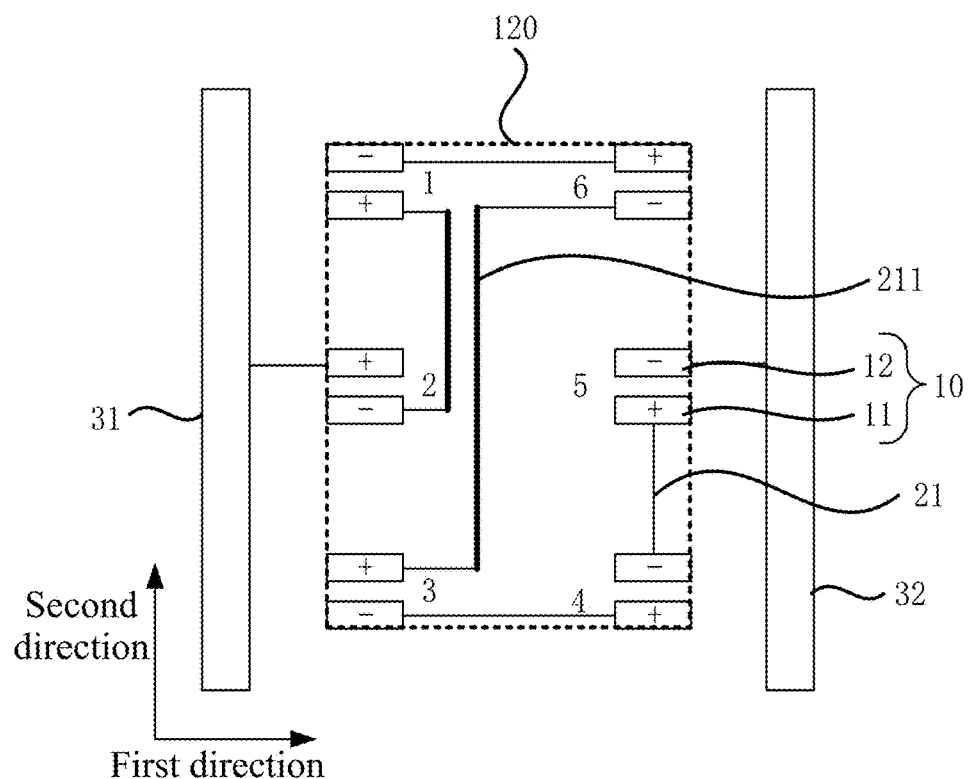
FIG. 25 is a top view of another backlight partition according to an embodiment of the present disclosure.

FIG. 25 is a top view of another backlight partition according to an embodiment of the present disclosure. Referring to FIG. 25, the second pad set 2, the first pad set 1, the sixth pad set 6, the third pad set 3, the fourth pad set 4, and the fifth pad set 5 are sequentially connected in series. Among the second pad set 2, the third pad set 3, and the sixth pad set 6, the first pad 11 is disposed on one side of the second pad 12 facing the second direction. Among the first pad set 1, the fourth pad set 4, and the fifth pad set 5, the second pad 12 is disposed on one side of the first pad 11 facing the second direction.

Figure 26:
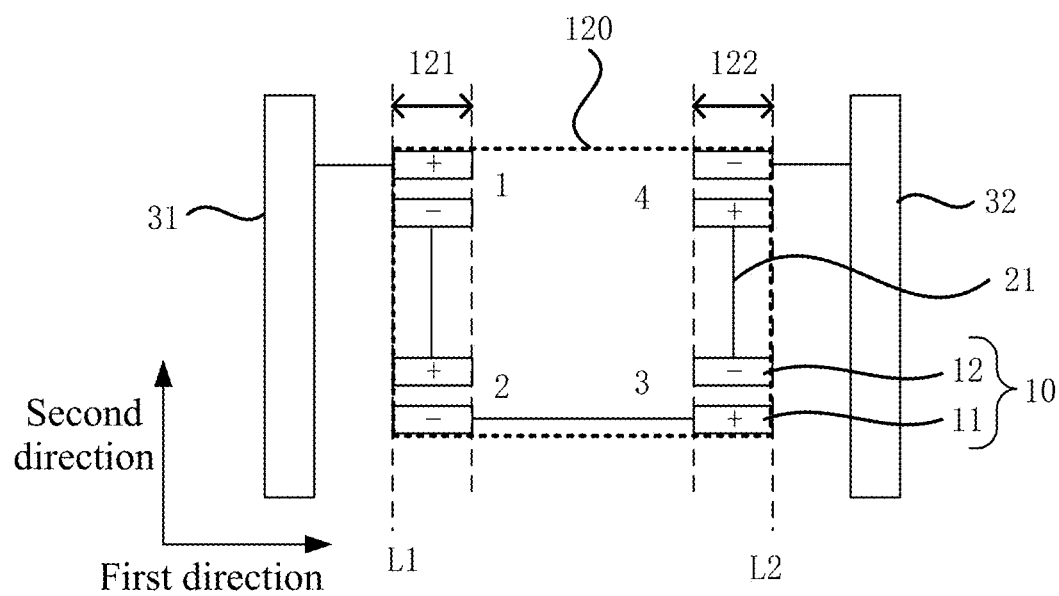
FIG. 26 is a top view of another backlight partition according to an embodiment of the present disclosure.

FIG. 26 is a top view of another backlight partition according to an embodiment of the present disclosure. Referring to FIG. 26, in the pad set 10 of the first pad set column 121, the first pad 11 is disposed on one side of the second pad 12 facing the second direction. In the pad set 10 of the second pad set column 122, the second pad 12 is disposed on one side of the first pad 11 facing the second direction.

By way of example, referring to FIG. 26, the first pad set column 121 includes the first pad set 1 and the second pad set 2, and the second pad set column 122 includes the third pad set 3 and the fourth pad set 4. The first pad set 1, the second pad set 2, the third pad set 3, and the fourth pad set 4 are sequentially connected in series.

On the one hand, as shown in FIGS. 2 and 26, along the second direction, in the pad sets in the same column, arrangement directions of the first pads 11 and the second pads 12 are the same. For example, in the pad set 10 of the first pad set column 121, the first pad 11 is disposed on one side of the second pad 12 facing the second direction. In the pad set 10 of the second pad set column 122, the second pad 12 is disposed on one side of the first pad 11 facing the second direction. Therefore, it is convenient to achieve a die-bonding process, the process is simplified, and the implementation difficulty is low. The die-bonding process refers to a process of bonding the light-emitting diodes to the driving substrate. In the pad sets 10 in the same column, the arrangement directions of the first pads 11 and the second pads 12 are the same. Therefore, arrangement directions of cathodes and anodes of the light-emitting diodes in the same column are the same, thereby reducing the difficulty of the bonding process.

Further, as shown in FIGS. 4, 5, 9, 10, 15, 16, 17, 18, and 19, along the second direction, in the pad sets 10 in the same column, the arrangement directions of the first pads 11 and the second pads 12 are the same. Moreover, among all the pad sets 10, the arrangement directions of the first pads 11 and the second pads 12 are the same. In the die-bonding process for bonding the light-emitting diodes to the driving substrate, the arrangement directions of the cathodes and anodes of all the light-emitting diodes are the same, so as to further reduce the difficulty of the bonding process, which facilitates the implementation of the die-bonding process, thereby simplifying the process.

On the other hand, as shown in FIGS. 2, 4, and 26, one first connection line 21 exists in one backlight partition 120 and includes a portion extending along the first direction (three first connection lines 21 which each include a portion extending along the first direction exist in FIG. 3). In this manner, in one backlight partition 120, one first connection line 21 that overlaps with wires in other films along the second direction exists, and a resulting overlap capacitance is relatively small. For example, the wires in other films may include data lines.

Figure 27:
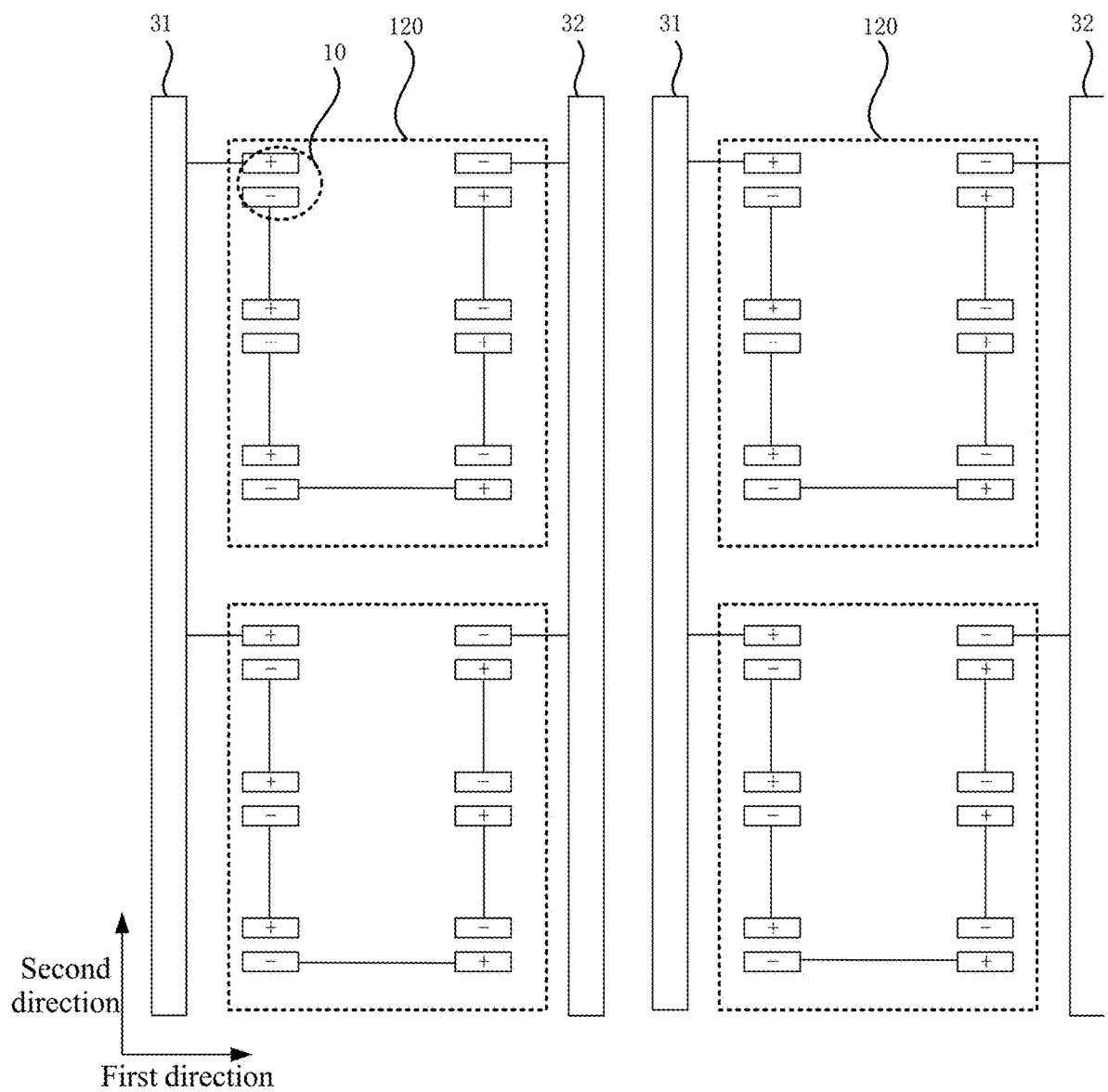
FIG. 27 is a top view showing part of another driving substrate according to an embodiment of the present disclosure.

FIG. 27 is a top view showing part of another driving substrate according to an embodiment of the present disclosure. Referring to FIG. 27, first connection terminals of multiple pad set groups arranged along the second direction are electrically connected to the same first power line 31, second connection terminals of multiple pad set groups arranged along the second direction are electrically connected to the same second power line 32. In the embodiment of the present disclosure, one set of the first power line 31 and the second power line 32 drives multiple pad set groups in one column, thereby lowering requirements for drive voltages of the first power line 31 and the second power line 32.

Figure 28:
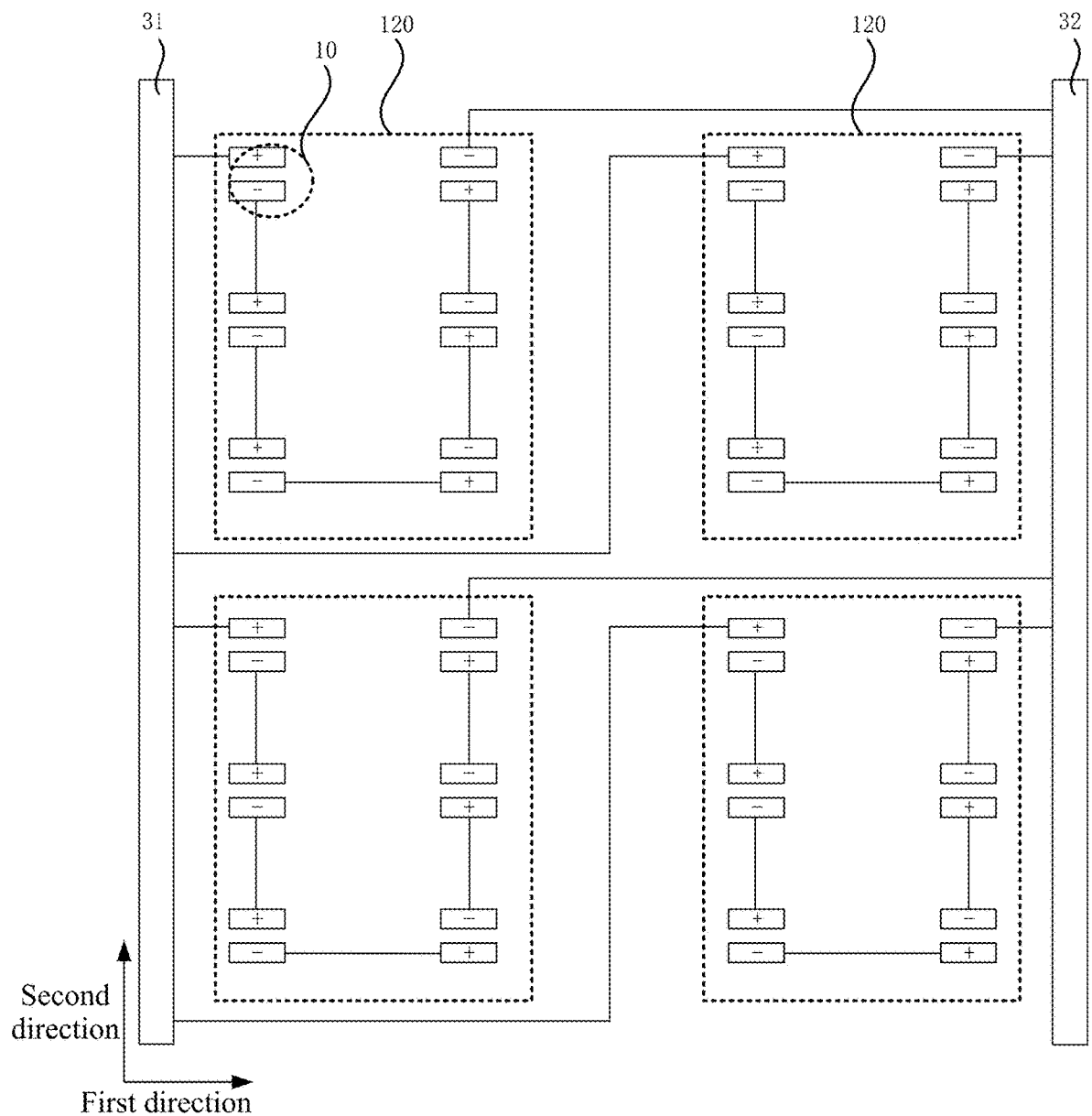
FIG. 28 is a top view showing part of another driving substrate according to an embodiment of the present disclosure.

FIG. 28 is a top view showing part of another driving substrate according to an embodiment of the present disclosure. Referring to FIG. 28, first connection terminals of two pad set groups arranged along the first direction are electrically connected to the same first power line 31, second connection terminals of two pad set groups arranged along the first direction are electrically connected to the same second power line 32. In the embodiment of the present disclosure, one set of the first power line 31 and the second power line 32 drives multiple pad set groups in two columns, thereby lowering requirements for the number of the first power lines 31 and the second power lines 32.

In an embodiment, a total of N pad set groups in one column arranged along the second direction exist, where one set of the first power line 31 and the second power line 32 is provided for M pad set groups, and N/M sets of the first power lines 31 and the second power lines 32 are provided for one column of pad set groups. N/M is a positive integer greater than 1. In the embodiment of the present disclosure, the backlight composed of the driving substrate may achieve two-dimensional local dimming.

In another embodiment, a total of N pad set groups in one column arranged along the second direction exist, where one set of the first power line 31 and the second power line 32 is provided for the N pad set groups. In the embodiment of the present disclosure, the backlight composed of the driving substrate may achieve one-dimensional local dimming.

By way of example, referring to FIG. 1, the driving substrate 100 includes one substrate 110, where the substrate 110 includes all backlight partitions 120, that is, all the backlight partitions 120 are disposed on the same substrate 110.

Figure 29:
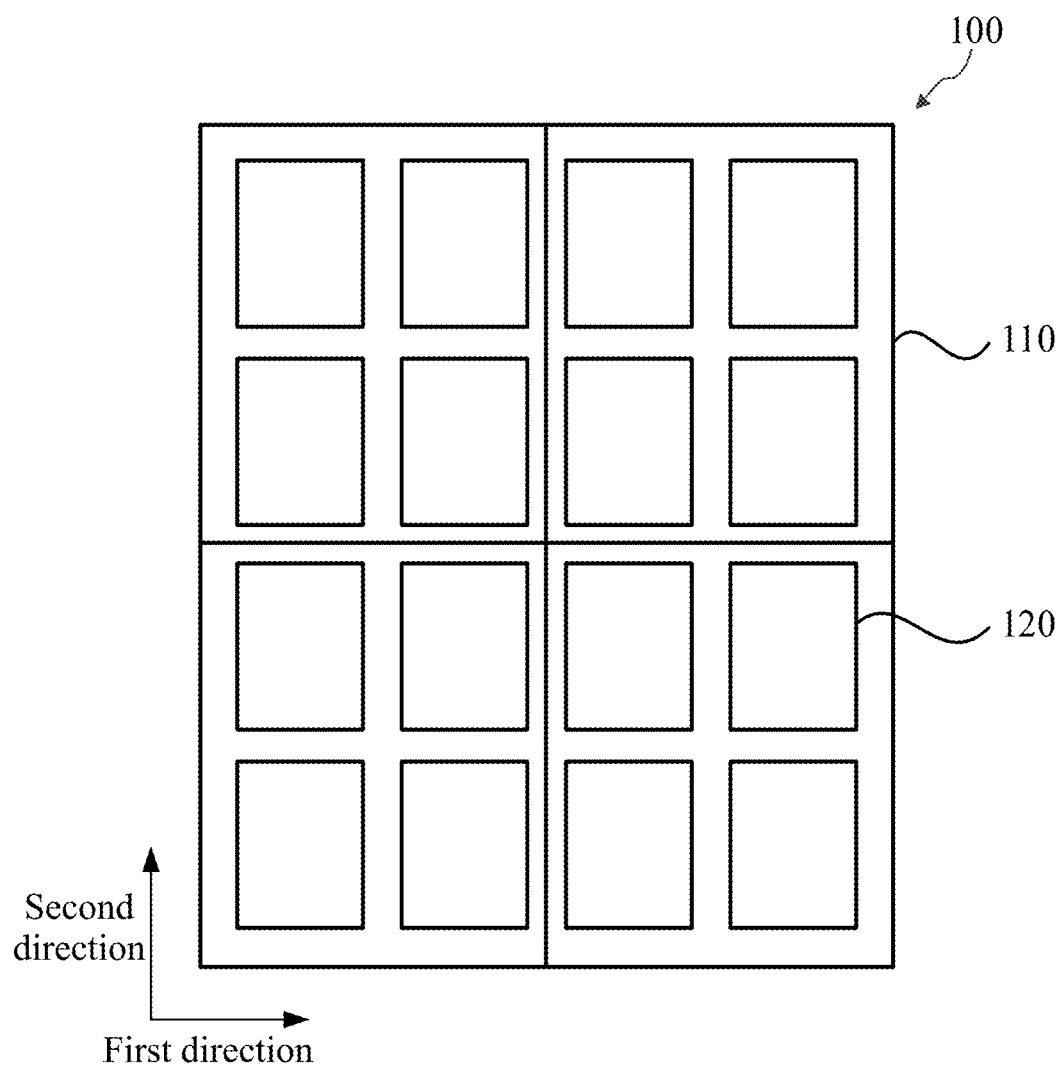
FIG. 29 is a top view of another driving substrate according to an embodiment of the present disclosure.

FIG. 29 is a top view of another driving substrate according to an embodiment of the present disclosure. Referring to FIG. 29, the driving substrate 100 further includes multiple substrates 110, where the substrate 110 includes at least one backlight partition 120, and the multiple substrates 110 are spliced and connected. In the embodiment of the present disclosure, the multiple substrates 110 are spliced, so as to form a driving substrate with a relatively large area, thereby forming a backlight with a relatively large area.

By way of example, the substrate 110 may include a PCB or a glass substrate.

Figure 30:
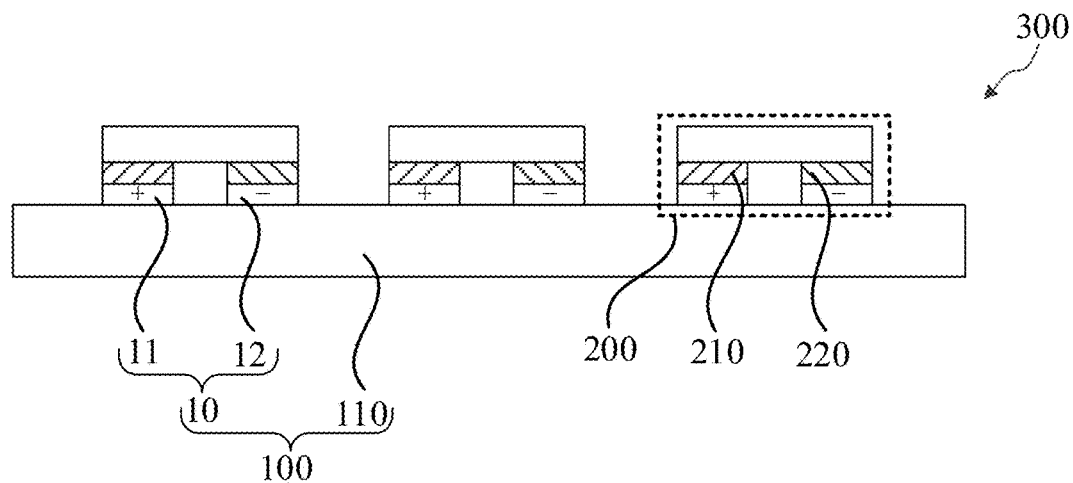
FIG. 30 is a sectional diagram of a backlight according to an embodiment of the present disclosure.

FIG. 30 is a sectional diagram of a backlight according to an embodiment of the present disclosure. Referring to FIG. 30, a backlight 300 includes the driving substrate 100 in any one of the preceding embodiments and multiple light-emitting diodes 200. The light-emitting diode 200 includes an anode 210 and a cathode 220, the anode 210 is electrically connected to the first pad 11, and the cathode 220 is electrically connected to the second pad 12. The driving substrate 100 is configured to drive the multiple light-emitting diodes 200 to emit light.

Figure 31:
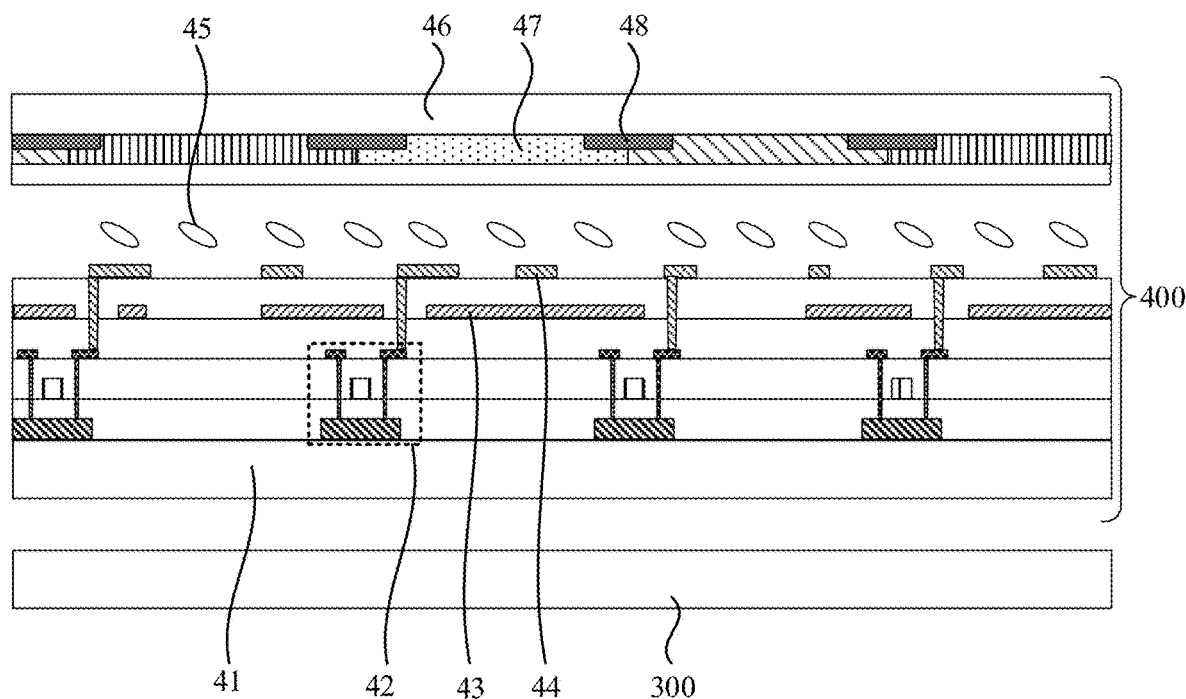
FIG. 31 is a sectional diagram of a display device according to an embodiment of the present disclosure.

FIG. 31 is a sectional diagram of a display device according to an embodiment of the present disclosure. Referring to FIG. 31, the display device includes the backlight 300 and a display panel 400. The backlight 300 is configured to provide backlight for the display panel 400.

By way of example, referring to FIG. 31, the display panel 400 is a liquid crystal display panel. The display panel 400 includes a first substrate 41, a second substrate 46, and a liquid crystal layer 45, where the liquid crystal layer 45 is disposed between the first substrate 41 and the second substrate 46. The display panel 400 further includes a pixel driving circuit 42, a common electrode 43, and a pixel electrode 44. The pixel driving circuit 42 includes a thin-film transistor, and in some embodiments, the pixel driving circuit may include a capacitor. Liquid crystal molecules in the liquid crystal layer 45 are flipped under the driving of an electric field generated by the common electrode 43 and the pixel electrode 44, so as to control the light transmittance, thereby enabling the display panel 400 to display images.

By way of example, referring to FIG. 31, the pixel driving circuit 42 is electrically connected to the pixel electrode 44. The pixel electrode 44 and the common electrode 43 are both disposed between the first substrate 41 and the liquid crystal layer 45. In other embodiments, the common electrode 43 may also be disposed between the second substrate 46 and the liquid crystal layer 45.

By way of example, referring to FIG. 31, the display panel 400 may further include a color resist 47 and a black matrix 48 that are both disposed between the second substrate 46 and the liquid crystal layer 45. Black matrices 48 may be arranged on an entire surface in a grid shape. The color resist 47 is disposed in a grid-like opening of the black matrices 48. The color resist 47 may enable the display panel 400 to achieve color display.

In an embodiment, multiple color resists 47 may include a red color resist, a green color resist, and a blue color resist. The red color resist is used for displaying the light passing through the red color resist as red, the green color resist is used for displaying the light passing through the green color resist as green, and the blue color resist is used for displaying the light passing through the blue color resist as blue.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure is described in detail in connection with the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A driving substrate, comprising: a plurality of backlight partitions arranged in an array;
   wherein each of the plurality of backlight partitions is provided with a first pad set column and a second pad set column, the first pad set column and the second pad set column are arranged along a first direction and each of the first pad set column and the second pad set column comprises a plurality of pad sets arranged along a second direction, and the first direction intersects with the second direction;
   a boundary on one side of the first pad set column facing away from the second pad set column is denoted as a first boundary, and a boundary on one side of the second pad set column facing away from the first pad set column is denoted as a second boundary;
   each of the plurality of pad sets comprises a first pad and a second pad arranged along the second direction;
   each of the plurality of backlight partitions is provided with first connection lines, and each of the first connection lines connects the first pad and the second pad that are disposed in two of the plurality of pad sets, respectively; and
   in a same backlight partition among the plurality of backlight partitions, along the first direction, the first connection lines are disposed between the first boundary and the second boundary.

2. The driving substrate of claim 1, wherein in a same backlight partition among the plurality of backlight partitions, one of the first connection lines disposed between two pad sets of the plurality of pad sets arranged along the first direction extends along the first direction.

3. The driving substrate of claim 2, wherein in each of the plurality of pad sets of the first pad set column, the first pad is disposed on one side of the second pad facing the second direction; and in each of the plurality of pad sets of the second pad set column, the second pad is disposed on one side of the first pad facing the second direction.

4. The driving substrate of claim 2, wherein the plurality of pad sets in the first pad set column comprise a first pad set, a second pad set, and a third pad set arranged along an opposite direction of the second direction, respectively;
- the plurality of pad sets in the second pad set column comprise a fourth pad set, a fifth pad set, and a sixth pad set arranged along the second direction, respectively;
- the second pad set, the third pad set, the fourth pad set, the fifth pad set, the first pad set, and the sixth pad set are sequentially connected in series; and
- among the first pad set, the fourth pad set, and the fifth pad set, the second pad is disposed on one side of the first pad facing the second direction, and among the second pad set, the third pad set, and the sixth pad set, the first pad is disposed on one side of the second pad facing the second direction.

5. The driving substrate of claim 1, wherein one of the first connection lines disposed between two of the plurality of pad sets arranged along the first direction comprises a first sub-line segment extending along the second direction;
- wherein one of the plurality of backlight partitions is provided with one first sub-line segment; or
- one of the plurality of backlight partitions is provided with a plurality of first sub-line segments disposed on a same straight line.

6. The driving substrate of claim 5, wherein one of the first connection lines disposed between two of the plurality of pad sets arranged along the second direction extends along the second direction.

7. The driving substrate of claim 6, wherein the plurality of pad sets in the first pad set column comprise a first pad set, a second pad set, and a third pad set arranged along an opposite direction of the second direction, respectively;
- the plurality of pad sets in the second pad set column comprise a fourth pad set, a fifth pad set, and a sixth pad set arranged along the second direction, respectively; and
- wherein the first pad set, the second pad set, the third pad set, the fourth pad set, the fifth pad set and the sixth pad set satisfy one of the following:
- the first pad set, the second pad set, the third pad set, the sixth pad set, the fifth pad set, and the fourth pad set being sequentially connected in series; or the first pad set, the sixth pad set, the fifth pad set, the second pad set, the third pad set, and the fourth pad set being sequentially connected in series; or the first pad set, the sixth pad set, the fifth pad set, the fourth pad set, the second pad set, and the third pad set being sequentially connected in series;
- wherein in each of the plurality of pad sets of the first pad set column, in any one of the plurality of pad sets, the first pad is disposed on one side of the second pad facing the second direction.

8. The driving substrate of claim 6, wherein the plurality of pad sets in the first pad set column comprise a first pad set, a second pad set, and a third pad set arranged along an opposite direction of the second direction, respectively;
- the plurality of pad sets in the second pad set column comprise a fourth pad set, a fifth pad set, and a sixth pad set arranged along the second direction, respectively;
- wherein the first pad set, the second pad set, the third pad set, the fourth pad set, the fifth pad set and the sixth pad set satisfy one of the following:
- the second pad set, the first pad set, the sixth pad set, the fifth pad set, the fourth pad set, and the third pad set being sequentially connected in series; or the first pad set, the second pad set, the third pad set, the fourth pad set, the sixth pad set, and the fifth pad set being sequentially connected in series;
- wherein in a case where the second pad set, the first pad set, the sixth pad set, the fifth pad set, the fourth pad set, and the third pad set are sequentially connected in series, in the first pad set, the second pad is disposed on one side of the first pad facing the second direction, and among the second pad set, the third pad set, the fourth pad set, the fifth pad set, and the sixth pad set, the first pad is disposed on one side of the second pad facing the second direction; and
- wherein in a case where the first pad set, the second pad set, the third pad set, the fourth pad set, the sixth pad set, and the fifth pad set being sequentially connected in series, in the fourth pad set, the second pad is disposed on one side of the first pad facing the second direction, and among the first pad set, the second pad set, the third pad set, the fifth pad set, and the sixth pad set, the first pad is disposed on one side of the second pad facing the second direction.

9. The driving substrate of claim 6, wherein the plurality of pad sets in the first pad set column comprise a first pad set, a second pad set, and a third pad set arranged along an opposite direction of the second direction, respectively;
- the plurality of pad sets in the second pad set column comprise a fourth pad set, a fifth pad set, and a sixth pad set arranged along the second direction, respectively;
- the second pad set, the third pad set, the fourth pad set, the first pad set, the sixth pad set, and the fifth pad set are sequentially connected in series; and
- among the first pad set and the fourth pad set, the second pad is disposed on one side of the first pad facing the second direction, and among the second pad set, the third pad set, the fifth pad set, and the sixth pad set, the first pad is disposed on one side of the second pad facing the second direction.

10. The driving substrate of claim 5, wherein one of the first connection lines disposed between two of the plurality of pad sets arranged along the second direction comprises a second sub-line segment extending along the first direction; and
- one of the plurality of backlight partitions is provided with one second sub-line segment.

11. The driving substrate of claim 10, wherein the plurality of pad sets in the first pad set column comprise a first pad set, a second pad set, and a third pad set arranged along an opposite direction of the second direction, respectively;
- the plurality of pad sets in the second pad set column comprise a fourth pad set, a fifth pad set, and a sixth pad set arranged along the second direction, respectively; and
- wherein the first pad set, the second pad set, the third pad set, the fourth pad set, the fifth pad set and the sixth pad set satisfy one of the following:
- the first pad set, the sixth pad set, the second pad set, the third pad set, the fifth pad set, and the fourth pad set being sequentially connected in series; or the first pad set, the sixth pad set, the fifth pad set, the second pad set, the fourth pad set, and the third pad set being sequentially connected in series; or the first pad set, the sixth pad set, the second pad set, the fifth pad set, the fourth pad set, and the third pad set being sequentially connected in series;

wherein in each of the plurality of pad sets of the first pad set column, in any one of the plurality of pad sets, the first pad is disposed on one side of the second pad facing the second direction.

12. The driving substrate of claim 10, wherein the plurality of pad sets in the first pad set column comprise a first pad set, a second pad set, and a third pad set arranged along an opposite direction of the second direction, respectively;

the plurality of pad sets in the second pad set column comprise a fourth pad set, a fifth pad set, and a sixth pad set arranged along the second direction, respectively;

the first pad set, the sixth pad set, the second pad set, the third pad set, the fourth pad set, and the fifth pad set are sequentially connected in series; and among the fourth pad set and the fifth pad set, the second pad is disposed on one side of the first pad facing the second direction, and among the first pad set, the second pad set, the third pad set, and the sixth pad set, the first pad is disposed on one side of the second pad facing the second direction.

13. The driving substrate of claim 10, wherein the plurality of pad sets in the first pad set column comprise a first pad set, a second pad set, and a third pad set arranged along an opposite direction of the second direction, respectively;

the plurality of pad sets in the second pad set column comprise a fourth pad set, a fifth pad set, and a sixth pad set arranged along the second direction, respectively;

the second pad set, the third pad set, the first pad set, the sixth pad set, the fifth pad set, and the fourth pad set are sequentially connected in series; and in the first pad set, the second pad is disposed on one side of the first pad facing the second direction, and among the second pad set, the third pad set, the fourth pad set, the fifth pad set, and the sixth pad set, the first pad is disposed on one side of the second pad facing the second direction.

14. The driving substrate of claim 10, wherein the plurality of pad sets in the first pad set column comprise a first pad set, a second pad set, and a third pad set arranged along an opposite direction of the second direction, respectively;

the plurality of pad sets in the second pad set column comprise a fourth pad set, a fifth pad set, and a sixth pad set arranged along the second direction, respectively;

the second pad set, the third pad set, the fourth pad set, the fifth pad set, the sixth pad set, and the first pad set are sequentially connected in series; and among the first pad set, the fourth pad set, the fifth pad set, and the sixth pad set, the second pad is disposed on one side of the first pad facing the second direction, and among the second pad set and the third pad set, the first pad is disposed on one side of the second pad facing the second direction.

15. The driving substrate of claim 10, wherein the plurality of pad sets in the first pad set column comprise a first pad set, a second pad set, and a third pad set arranged along an opposite direction of the second direction, respectively;

the plurality of pad sets in the second pad set column comprise a fourth pad set, a fifth pad set, and a sixth pad set arranged along the second direction, respectively;

the second pad set, the first pad set, the sixth pad set, the fifth pad set, the third pad set, and the fourth pad set are sequentially connected in series; and in the first pad set, the second pad is disposed on one side of the first pad facing the second direction, and among the second pad set, the third pad set, the fourth pad set, the fifth pad set, and the sixth pad set, the first pad is disposed on one side of the second pad facing the second direction.

16. The driving substrate of claim 5, wherein one of the first connection lines disposed between two of the plurality of pad sets arranged along the second direction comprises a second sub-line segment extending along the first direction; and one of the plurality of backlight partitions is provided with two second sub-line segments arranged along the second direction.

17. The driving substrate of claim 16, wherein the plurality of pad sets in the first pad set column comprise a first pad set, a second pad set, and a third pad set arranged along an opposite direction of the second direction, respectively;

the plurality of pad sets in the second pad set column comprise a fourth pad set, a fifth pad set, and a sixth pad set arranged along the second direction, respectively; and wherein the first pad set, the second pad set, the third pad set, the fourth pad set, the fifth pad set and the sixth pad set satisfy one of the following:

the first pad set, the second pad set, the sixth pad set, the fifth pad set, the third pad set, and the fourth pad set being sequentially connected in series; or the first pad set, the sixth pad set, the second pad set, the fifth pad set, the third pad set, and the fourth pad set being sequentially connected in series.

18. The driving substrate of claim 1, further comprising: a first power line and a second power line;

wherein the plurality of pad sets in a same backlight partition among the plurality of backlight partitions are connected in series to form a pad set group, and the pad set group comprises a first connection terminal and a second connection terminal; first connection terminals of a plurality of pad set groups arranged along the second direction are electrically connected to a same first power line, and second connection terminals of a plurality of pad set groups arranged along the second direction are electrically connected to a same second power line;

wherein first connection terminals of two of the plurality of pad set groups arranged along the first direction are electrically connected to a same first power line, and second connection terminals of two of the plurality of pad set groups arranged along the first direction are electrically connected to a same second power line.

19. The driving substrate of claim 1, further comprising: a substrate, where the substrate comprises all of the plurality of backlight partitions; or the driving substrate further comprises a plurality of substrates, wherein each of the plurality of substrates comprises at least one of the plurality of backlight partitions, and the plurality of substrates are spliced and connected.

20. A backlight, comprising: a driving substrate and a plurality of light-emitting diodes;

wherein the driving substrate comprises: a plurality of backlight partitions arranged in an array;

wherein each of the plurality of backlight partitions is provided with a first pad set column and a second pad set column, the first pad set column and the second pad set column are arranged along a first direction and each of the first pad set column and the second pad set column comprises a plurality of pad sets arranged along a second direction, and the first direction intersects with the second direction;

a boundary on one side of the first pad set column facing away from the second pad set column is denoted as a first boundary, and a boundary on one side of the second pad set column facing away from the first pad set column is denoted as a second boundary;

each of the plurality of pad sets comprises a first pad and a second pad arranged along the second direction;

each of the plurality of backlight partitions is provided with first connection lines, and each of the first connection lines connects the first pad and the second pad that are disposed in two of the plurality of pad sets, respectively; and in a same backlight partition among the plurality of backlight partitions, along the first direction, the first connection lines are disposed between the first boundary and the second boundary;

wherein each of the plurality of light-emitting diodes comprises an anode and a cathode, the anode is electrically connected to the first pad, and the cathode is electrically connected to the second pad.

21. A display device, comprising: a backlight and a display panel;

wherein the backlight comprises: a driving substrate and a plurality of light-emitting diodes;

wherein the driving substrate comprises: a plurality of backlight partitions arranged in an array;

wherein each of the plurality of backlight partitions is provided with a first pad set column and a second pad set column, the first pad set column and the second pad set column are arranged along a first direction and each of the first pad set column and the second pad set column comprises a plurality of pad sets arranged along a second direction, and the first direction intersects with the second direction;

a boundary on one side of the first pad set column facing away from the second pad set column is denoted as a first boundary, and a boundary on one side of the second pad set column facing away from the first pad set column is denoted as a second boundary;

each of the plurality of pad sets comprises a first pad and a second pad arranged along the second direction;

each of the plurality of backlight partitions is provided with first connection lines, and each of the first connection lines connects the first pad and the second pad that are disposed in two of the plurality of pad sets, respectively; and in a same backlight partition among the plurality of backlight partitions, along the first direction, the first connection lines are disposed between the first boundary and the second boundary;

wherein each of the plurality of light-emitting diodes comprises an anode and a cathode, the anode is electrically connected to the first pad, and the cathode is electrically connected to the second pad.

* * * * *